(12) United States Patent
Basler et al.

(10) Patent No.: US 11,404,370 B2
(45) Date of Patent: Aug. 2, 2022

(54) FAILURE STRUCTURE IN SEMICONDUCTOR DEVICE

(71) Applicant: Infineon Technologies AG, Neubiberg (DE)

(72) Inventors: Thomas Basler, Ottenhofen (DE);
Andreas Huerner, Nuremberg (DE);
Caspar Leendertz, Munich (DE);
Dethard Peters, Hoechstadt (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 100 days.

(21) Appl. No.: 16/697,580

(22) Filed: Nov. 27, 2019

(65) Prior Publication Data
US 2021/0159172 A1    May 27, 2021

(51) Int. Cl.
*H01L 23/525* (2006.01)
*H01L 23/62* (2006.01)
*H01L 23/52* (2006.01)
*H01L 29/16* (2006.01)

(52) U.S. Cl.
CPC .......... *H01L 23/5252* (2013.01); *H01L 23/62* (2013.01); *H01L 29/1608* (2013.01)

(58) Field of Classification Search
CPC ............................ H01L 23/5252; H01L 23/62
See application file for complete search history.

(56) References Cited

U.S. PATENT DOCUMENTS

| 6,284,604 | B1 * | 9/2001 | Tihanyi | H01L 29/4175 |
| | | | | 257/E29.267 |
| 2012/0286355 | A1 * | 11/2012 | Mauder | H01L 29/7393 |
| | | | | 257/330 |
| 2019/0326217 | A1 * | 10/2019 | Patané | H01L 29/1608 |
| 2020/0098910 | A1 * | 3/2020 | Nakagawa | H01L 29/7813 |

FOREIGN PATENT DOCUMENTS

| JP | S6181663 A | 4/1986 |
| JP | H04162677 A | 6/1992 |
| JP | 2018056379 A | 4/2018 |

* cited by examiner

*Primary Examiner* — Omar F Mojaddedi
(74) *Attorney, Agent, or Firm* — Cooper Legal Group LLC

(57) ABSTRACT

A semiconductor device is provided. In an embodiment, the semiconductor device comprises a control region, a first power region, a second power region, an isolation region and/or a short circuit structure. The control region comprises a control terminal. The first power region comprises a first power terminal. The second power region comprises a second power terminal. The isolation region is between the control region and the first power region. The short circuit structure extends from the first power region, through the isolation region, to the control region. The short circuit structure is configured to form a low-resistive connection between the control region and the first power region during a failure state of the semiconductor device.

17 Claims, 18 Drawing Sheets

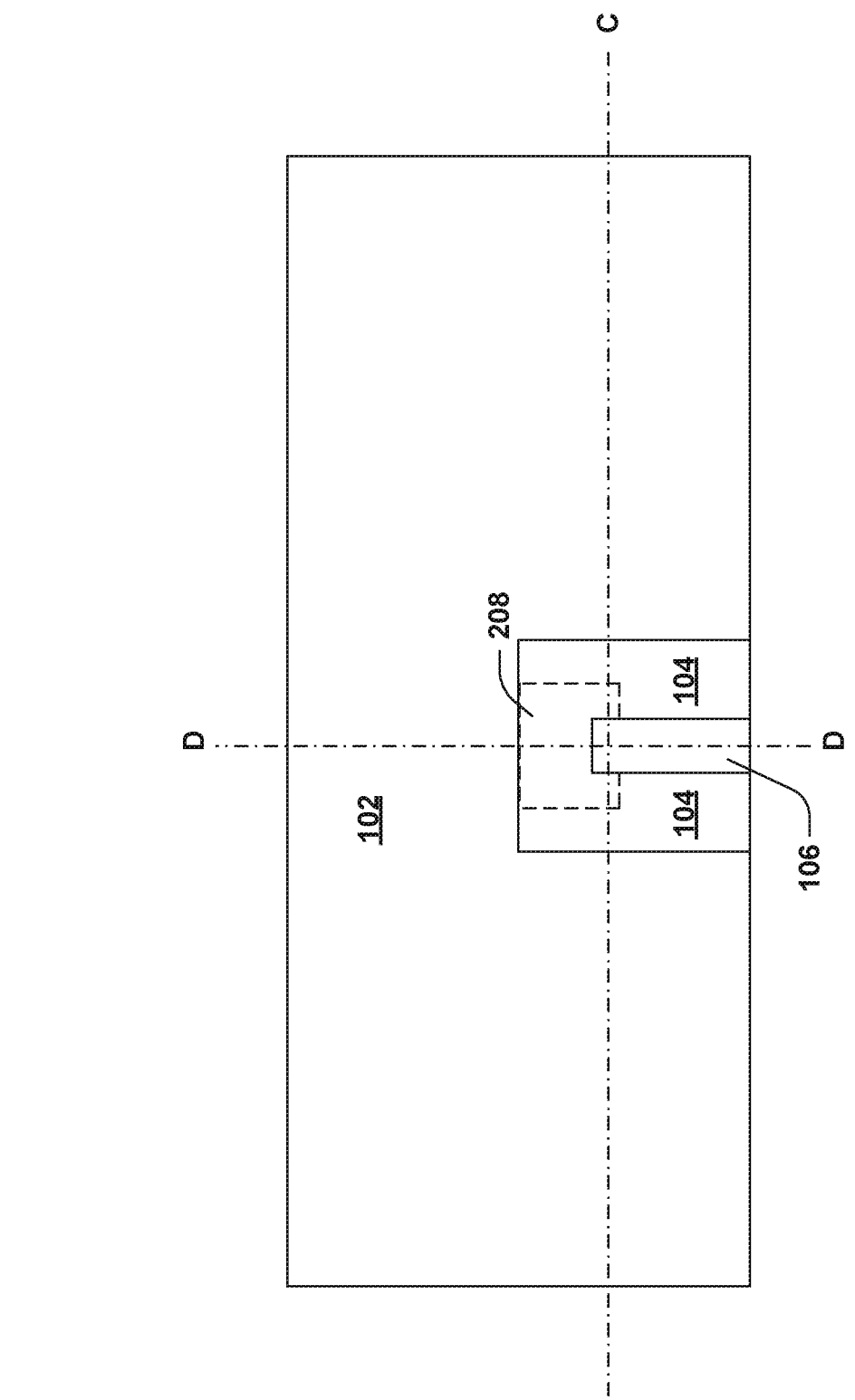

FAILURE STRUCTURE IN SEMICONDUCTOR DEVICE

TECHNICAL FIELD

The present disclosure relates to semiconductor devices.

BACKGROUND

A semiconductor device, such as a transistor, a thyristor, etc., may enter a failure state. The failure state may correspond to a short-circuit between power terminals of the semiconductor device. The failure state may cause an explosion of the semiconductor device, production of arcs and/or damage to one or more surrounding components.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In an embodiment, a semiconductor device is provided. The semiconductor device may comprise a control region, a first power region, a second power region, an isolation region and/or a short circuit structure. The control region may comprise a control terminal. The first power region may comprise a first power terminal. The second power region may comprise a second power terminal. The isolation region may be between the control region and the first power region. The short circuit structure may extend from the first power region, through the isolation region, to the control region. The short circuit structure may be configured to form a low-resistive connection between the control region and the first power region during a failure state of the semiconductor device.

In an embodiment, a semiconductor device is provided. The semiconductor device may comprise a semiconductor substrate, a control region, a first power region, a second power region, an isolation region and/or a failure structure. The semiconductor substrate may comprise silicon carbide (SiC). The control region may comprise a control terminal. The first power region may comprise a first power terminal. The second power region may comprise a second power terminal. The isolation region may be between the control region and the first power region. The isolation region may overly the semiconductor substrate. The failure structure may extend from the first power region, through the isolation region, to the control region. The failure structure may be configured to change a characteristic of at least some material between the control region and the first power region during a failure state of the semiconductor device.

In an embodiment, a semiconductor device is provided. The semiconductor device may comprise a semiconductor substrate, a control region, a first power region, a second power region, an isolation region, a transition structure and/or a dielectric structure. The semiconductor substrate may comprise SiC. The control region may comprise a control terminal. The first power region may comprise a first power terminal. The second power region may comprise a second power terminal. The isolation region may be between the control region and the first power region. The isolation region may overly the semiconductor substrate. The transition structure may extend from the first power region, through the isolation region, to the control region. The dielectric structure may surround a portion of the first power region. The dielectric structure may define an opening between the first power region and the transition structure.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DESCRIPTION OF THE DRAWINGS

FIG. 2A illustrates an embodiment of a semiconductor device.

DETAILED DESCRIPTION

Figure 1A:
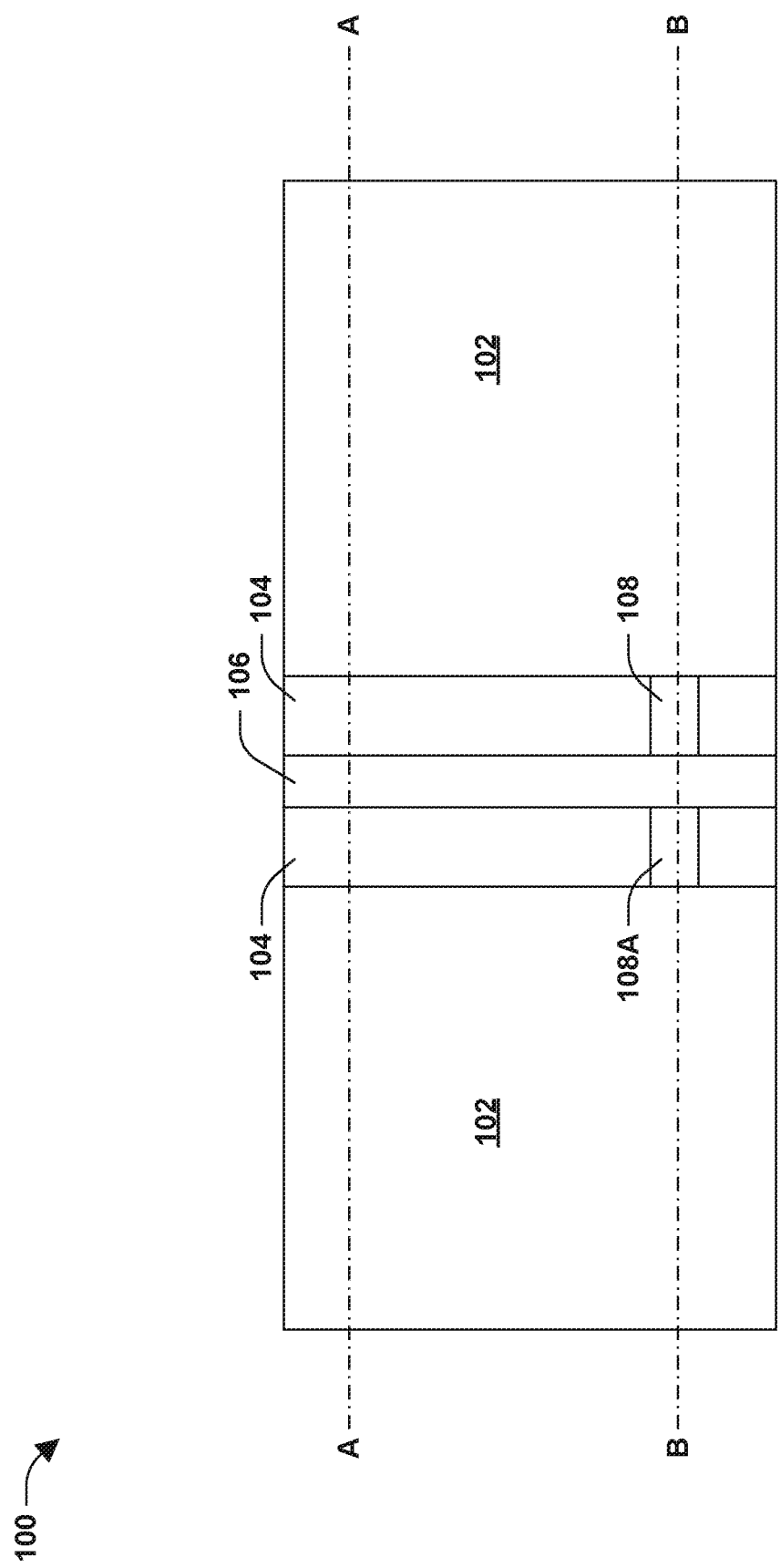
FIG. 1A illustrates an embodiment of a semiconductor device.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

It is to be understood that the following description of embodiments is not to be taken in a limiting sense. The scope of the present disclosure is not intended to be limited by the embodiments described hereinafter or by the drawings, which are taken to be illustrative only. The drawings are to be regarded as being schematic representations and elements illustrated in the drawings are not necessarily shown to scale. Rather, the various elements are represented such that their function and general purpose become apparent to a person skilled in the art.

All numerical values within the detailed description and the claims herein are modified by "about" or "approximately" the indicated value, and take into account experimental error and variations that would be expected by a person having ordinary skill in the art.

The term "over" and/or "overlying" is not to be construed as meaning only "directly over" and/or "having direct contact with". Rather, if one element is "over" and/or "overlying" another element (e.g., a region is overlying another region), a further element (e.g., a further region) may be positioned between the two elements (e.g., a further region may be positioned between a first region and a second region if the first region is "over" and/or "overlying" the second region). Further, if a first element is "over" and/or "overlying" a second element, at least some of the first element may be vertically coincident with the second element, such that a vertical line may intersect the first element and the second element.

The semiconductor substrate or body may extend along a main extension plane. The term "horizontal" as used in this specification intends to describe an orientation substantially parallel to said main extension plane. A first or main horizontal side of the semiconductor substrate or body may run substantially parallel to horizontal directions or may have surface sections that enclose an angle of at most 8° (or at most 6°) with the main extension plane. The first or main horizontal side can be for instance the surface of a wafer or a die. Sometimes, the horizontal direction is also referred to as lateral direction.

The term "vertical" as used in this specification intends to describe an orientation which is substantially arranged perpendicular to the horizontal direction, (e.g., parallel to the normal direction of the first side of the semiconductor substrate or body or parallel to the normal direction of a surface section of the first side of the semiconductor substrate or body).

A semiconductor device is provided. The semiconductor device may comprise a three-terminal device, such as a transistor and/or a thyristor. Alternatively and/or additionally, the semiconductor device may comprise a device with more than three terminals. The semiconductor device may comprise a control terminal (e.g., a gate), a first power terminal (e.g., a source terminal and/or an emitter terminal) and/or a second power terminal (e.g., a drain terminal and/or a collector terminal).

The semiconductor device may enter a failure state. The failure state may correspond to a high level of current flowing through the semiconductor device. Alternatively and/or additionally, the failure state may correspond to a high temperature of the semiconductor device. For example, the failure state may correspond to the semiconductor device having a short circuit between the first power terminal and the second power terminal, which may lead to the high level of current and/or the high temperature. The failure state of the semiconductor device may lead to and/or cause destruction of the semiconductor device and/or damage to one or more components surrounding the semiconductor device. For example, the semiconductor device may explode and/or produce arcs as a result of the high level of current and/or the high temperature. Alternatively and/or additionally, the high level of current and/or the high temperature may lead to bond wire melting.

The semiconductor device may have a short circuit withstand time window, such as greater than and/or equal to 1 µs. For example, upon the semiconductor device entering the failure state, the semiconductor device may cause destruction and/or damage after a time period corresponding to the short circuit withstand time window. Accordingly, in order to prevent damage to the one or more components, the semiconductor device may turn off and/or shut down within the short circuit withstand time window.

In accordance with the present disclosure, a semiconductor device is provided comprising a control region comprising a control terminal, a first power region comprising a first power terminal, a second power region comprising a second power terminal, an isolation region between the control region and the first power region and/or a failure structure extending from the first power region, through the isolation region, to the control region. The failure structure may be configured to form a low-resistive connection between the control region and the first power region during a failure state of the semiconductor device. Accordingly, the semiconductor device may turn off and/or shut down before causing destruction to one or more surrounding components.

In an embodiment of the presently disclosed embodiments, a semiconductor device is provided. The semiconductor device may comprise a three-terminal device, such as a transistor and/or a thyristor. Alternatively and/or additionally, the semiconductor device may comprise a device with more than three terminals. In some examples, the semiconductor device may comprise a field-effect transistor (FET), a metal-oxide-semiconductor FET (MOSFET), a metal-insulator-semiconductor FET (MISFET), a metal-semiconductor FET (MESFET), an insulated-gate FET (IGFET), an insulated-gate bipolar transistor (IGBT), a high-electron mobility transistor (HEMT), a heterostructure FET (HFET) and/or a modulation-doped FET (MODFET). Alternatively and/or additionally, the semiconductor device may comprise a type of transistor not listed herein.

The semiconductor device may comprise a control region comprising a control terminal, a first power region comprising a first power terminal, a second power region comprising a second power terminal, an isolation region between the control region and the first power region, and/or a short circuit structure extending from the first power region, through the isolation region, to the control region. The short circuit structure may be configured to form a low-resistive connection between the control region and the first power region during a failure state of the semiconductor device.

The failure state may correspond to a high level of current flowing through the semiconductor device (e.g., between the first power region and the second power region). The high level of current may correspond to a level of current exceeding a rated current of the semiconductor device (e.g., the high level of current may exceed the rated current by a threshold). Alternatively and/or additionally, the failure state may correspond to a high temperature of at least a portion of the semiconductor device. The high temperature and/or the high level of current may contribute to an explosion of the semiconductor device and/or damage to one or more components surrounding the semiconductor device.

The failure state may correspond to the semiconductor device having a short circuit between the first power terminal and the second power terminal. The short circuit may lead to the high level of current and/or the high temperature. For example, the semiconductor device may enter the failure state responsive to occurrence of the short circuit between the first power terminal and the second power terminal.

In some examples, the low-resistive connection may correspond to a short circuit between the control region and the first power region. The semiconductor device may turn off responsive to the low-resistive connection being formed. Current flow through the semiconductor device (e.g., current flow between the first power region and the second power region) may be mitigated (e.g., blocked and/or inhibited) by the semiconductor device responsive to the low-resistive connection being formed. A temperature of the semiconductor device may decrease responsive to the low-resistive connection being formed. Accordingly, an explosion of the semiconductor device and/or damage to one or more surrounding components may be prevented by forming the low-resistive connection.

In some examples, the first power region comprises a first portion adjacent to the short circuit structure. The failure state of the semiconductor device may correspond to a temperature of the first portion of the first power region exceeding a first melting point (e.g., between 500° C. and 800° C. and/or between 900° C. and 1200° C.) of the first portion of the first power region. During the failure state of the semiconductor device, material of the first portion of the first power region melts to form the low-resistive connection.

In some examples, the failure state of the semiconductor device may correspond to a temperature of the short circuit structure exceeding a melting point of the short circuit structure. During the failure state of the semiconductor device, material of the short circuit structure melts to form the low-resistive connection.

The short circuit structure may comprise a transition structure extending from the first power region to the control region. In some examples, the transition structure comprises a void, a capillary and/or a cavity (e.g., a hollow cavity).

In some examples, during the failure state of the semiconductor device, melted material of the first power region passes through the transition structure and contacts the control region to form the low-resistive connection.

The semiconductor device may comprise a dielectric structure surrounding a portion of the first power region. The dielectric structure may define an opening between the first power region and the transition structure. During the failure state of the semiconductor device, melted material of the first power region (e.g., melted material of the portion of the first power region) may pass through the opening and the transition structure. The melted material may contact the control region to form the low-resistive connection.

The first power region may comprise a first portion and a second portion. The semiconductor device may comprise a dielectric structure surrounding at least some of the first portion of the first power region. A portion of the isolation region may be between the first portion of the first power region and the second portion of the first power region. The first portion of the first power region may be between the second portion of the first power region and the transition structure. During the failure state of the semiconductor device, melted material of the first portion of the first power region may pass through the transition structure and contact the control region to form the low-resistive connection.

In some examples, a first material of the first portion of the first power region may be the same as a second material of the second portion of the first power region. In some examples, the first material and/or the second material may comprise aluminum and/or copper.

Alternatively and/or additionally, the first material may be different than the second material. For example, the first material may comprise aluminum. The second material may comprise copper.

Alternatively and/or additionally, the first material and/or the second material may comprise germanium, manganese (III) oxide ($Mn_2O_3$), nickel(II) oxide (NiO), cobalt(III) oxide ($Co_2O_3$), copper(I) oxide ($Cu_2O$), iron(III) oxide ($Fe_2O_3$), titanium dioxide ($TiO_2$), aluminum oxide ($Al_2O_3$), beryllium oxide (BeO), magnesium oxide (MgO), zirconium dioxide ($ZrO_2$), yttrium oxide ($Y_2O_3$), dysprosium oxide ($Dy_2O_3$) and/or germanium telluride (GeTe).

In some examples, a first melting point (e.g., between 500° C. and 800° C.) of the first material may be less than a second melting point (e.g., between 900° C. and 1200° C.) of the second material. During the failure state, a temperature of the first power region may exceed the first melting point and/or the temperature may not exceed the second melting point. Accordingly, merely the first portion of the first power region may melt during the failure state. Alternatively and/or additionally, the temperature of the first power region may exceed the first melting point and the second melting point. Accordingly, the first portion and the second portion of the first power region may melt during the failure state.

In some examples, the first power region comprises a first portion and a second portion. A first material (e.g., aluminum) of the first portion of the first power region may be different than a second material (e.g., copper) of the second portion of the first power region. The first portion of the first power region may be between the second portion of the first power region and the transition structure. During the failure state of the semiconductor device, melted material of the first portion of the first power region passes through the transition structure and contacts the control region to form the low-resistive connection. In some examples, a first melting point (e.g., between 500° C. and 800° C.) of the first material is less than a second melting point (e.g., between 900° C. and 1200° C.) of the second material.

In some examples, the first power region comprises a first portion and a second portion. A first melting point (e.g., between 500° C. and 800° C.) of the first portion of the first power region may be less than a second melting point (e.g., between 900° C. and 1200° C.) of the second portion of the first power region. The first portion of the first power region may be between the second portion of the first power region and the transition structure. During the failure state of the semiconductor device, melted material of the first portion of the first power region passes through the transition structure and contacts the control region to form the low-resistive connection. In some examples, the first portion of the first power region comprises aluminum and/or the second portion of the first power region comprises copper.

In some examples, the semiconductor device comprises a semiconductor substrate. The isolation region may overly the semiconductor substrate. The semiconductor substrate may comprise silicon carbide (SiC), gallium arsenide (GaAs), gallium nitride (GaN) and/or gallium(II) oxide ($Ga_2O_3$). Alternatively and/or additionally, the semiconductor substrate may comprise a different material, such as silicon.

The semiconductor substrate may have a band gap greater than 1.1 electron volts (eV). Alternatively and/or additionally, the semiconductor substrate may have a wide band gap (e.g., a band gap greater than 2 eV).

In an example, the semiconductor substrate may comprise SiC. The semiconductor substrate may comprise SiC in crystalline form. The semiconductor substrate may comprise a single SiC polytype (e.g., one of 4H—SiC polytype, 2H—SiC polytype, 6H—SiC polytype, etc.). Alternatively and/or additionally, the semiconductor substrate may comprise multiple SiC polytypes. The semiconductor substrate may comprise impurities and/or dopants within levels associated with fabrication tolerances.

In some examples, the control terminal comprises a gate terminal. The first power terminal may comprise a source terminal and/or an emitter terminal. The second power terminal may comprise a drain terminal and/or a collector terminal.

In an embodiment of the presently disclosed embodiments, a semiconductor device is provided. The semiconductor device may comprise a semiconductor substrate comprising SiC, a control region comprising a control terminal, a first power region comprising a first power terminal, a second power region comprising a second power terminal, an isolation region between the control region and the first power region, and/or a failure structure extending from the first power region, through the isolation region, to the control region. The isolation region may overly the semiconductor substrate. The failure structure may be configured to change a characteristic of at least some material between the control region and the first power region during a failure state of the semiconductor device.

In some examples, the characteristic may correspond to a resistance. For example, the failure structure may be configured to change a resistance between the control region and the first power region.

A first temperature of the failure structure during a normal state of the semiconductor device may be less than a second temperature of the failure structure during the failure state. A first resistance of the failure structure during the normal state may be higher than a second resistance of the failure structure during the failure state.

The normal state may correspond to a state of the semiconductor device before the semiconductor device enters the failure state.

In some examples, a material of the failure structure may have one or more properties (e.g., a composition and/or one or more chemical properties) associated with a decrease in resistance of the material as a temperature of the material increases. The material may be connected to the control region and the first power region. In an example, the failure material has a negative temperature coefficient (NTC). In an example, the failure material may comprise one or more small band gap materials, such as germanium. Alternatively and/or additionally, the failure material may comprise one or more metal-oxide compounds, such as $Mn_2O_3$, $NiO$, $Co_2O_3$, $Cu_2O$, $Fe_2O_3$, $TiO_2$, $Al_2O_3$, $BeO$, $MgO$, $ZrO_2$, $Y_2O_3$ and/or $Dy_2O_3$. Alternatively and/or additionally, the failure material may comprise one or more phase change memory materials, such as GeTe.

The failure structure changing from the first resistance to the second resistance may cause a reduction in current flow through the semiconductor device (e.g., current flow between the first power region and the second power region) and/or a decrease in temperature of the semiconductor device. Thus, destruction of the semiconductor device and/or damage to one or more surrounding components may be prevented.

The failure structure with the second resistance may correspond to a low-resistive connection (and/or a short circuit) between the control region and the first power region.

In an embodiment of the presently disclosed embodiments, a semiconductor device is provided. The semiconductor device may comprise a semiconductor substrate comprising SiC, a control region comprising a control terminal, a first power region comprising a first power terminal, a second power region comprising a second power terminal, an isolation region between the control region and the first power region, a transition structure extending from the first power region, through the isolation region, to the control region, and/or a dielectric structure surrounding a portion of the first power region. The isolation region may overly the semiconductor substrate. The dielectric structure may define an opening between the first power region and the transition structure.

FIGS. 1A-1F illustrate aspects with respect to an exemplary embodiment of a semiconductor device 100. FIG. 1A illustrates a portion of the semiconductor device 100. The semiconductor device 100 may comprise a first power region 102 comprising a first power terminal. The first power terminal is not shown in FIG. 1A. The first power terminal may be coupled to first external circuitry (e.g., a power source, a load of the semiconductor device 100 and/or ground). The first power terminal may comprise a source terminal and/or an emitter terminal. One or more source structures and/or emitter structures of one or more cells of the semiconductor device 100 may be electrically connected to the first external circuitry via the first power region 102 (e.g., a source bus structure and/or an emitter bus structure).

The semiconductor device 100 may comprise a control region 106 comprising a control terminal. The control terminal is not shown in FIG. 1A. The control terminal may be coupled to second external circuitry (e.g., a controller configured to control the semiconductor device 100 and/or a gate driver). The control terminal may comprise a gate terminal. One or more gate structures of one or more cells of the semiconductor device 100 may be electrically connected to the second external circuitry via the control region 106 (e.g., a gate runner structure).

The semiconductor device 100 may comprise an isolation region 104 between the first power region 102 and the control region 106. The isolation region 104 may insulate the first power region 102 from the control region 106. The isolation region 104 may comprise a first dielectric material, such as borophosphosilicate glass (BPSG), phosphosilicate glass (PSG), silicon dioxide ($SiO_2$) and/or silicon oxynitride (SiON). In some examples, the first dielectric material may comprise a single type of dielectric material. Alternatively and/or additionally, the first dielectric material may comprise multiple types of dielectric materials (e.g., a stack of different dielectric materials).

Figure 1B:
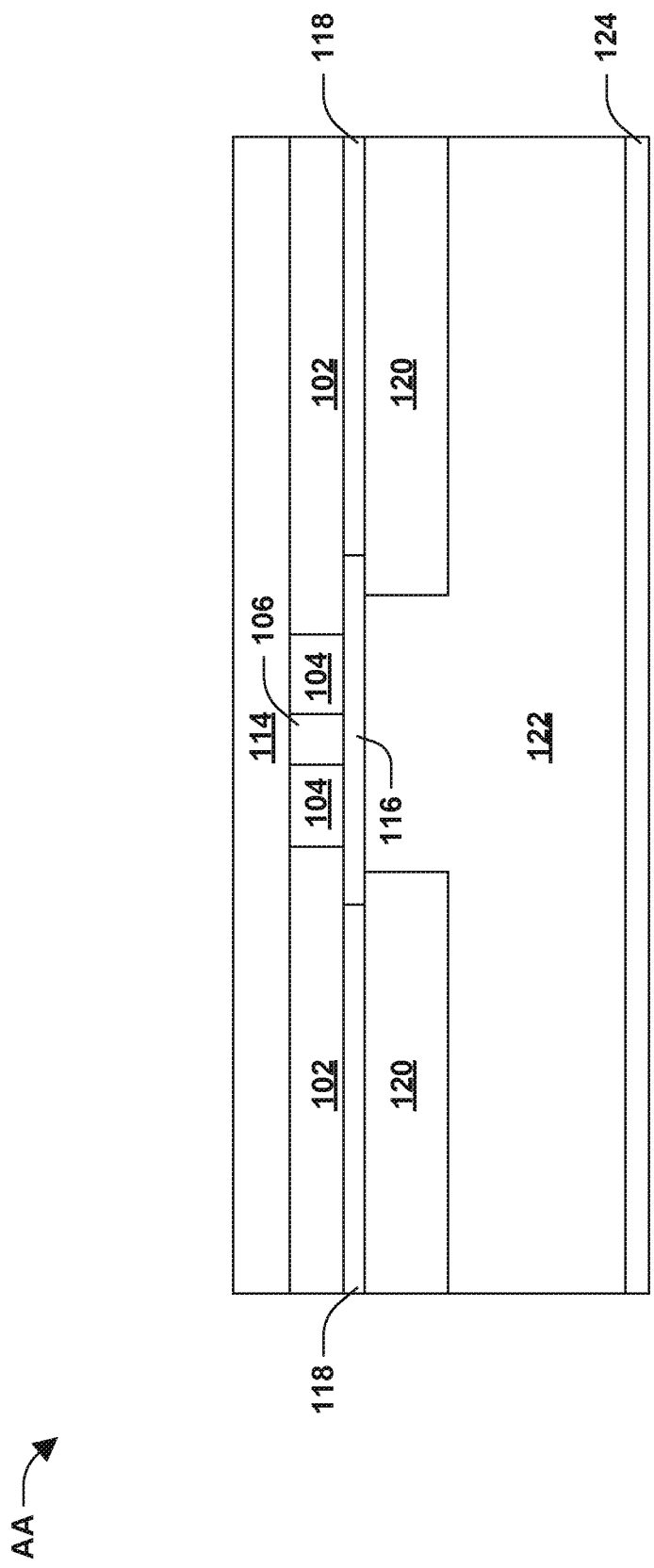
FIG. 1B illustrates a cross-section, defined in FIG. 1A, of a semiconductor device.
Figure 1C:
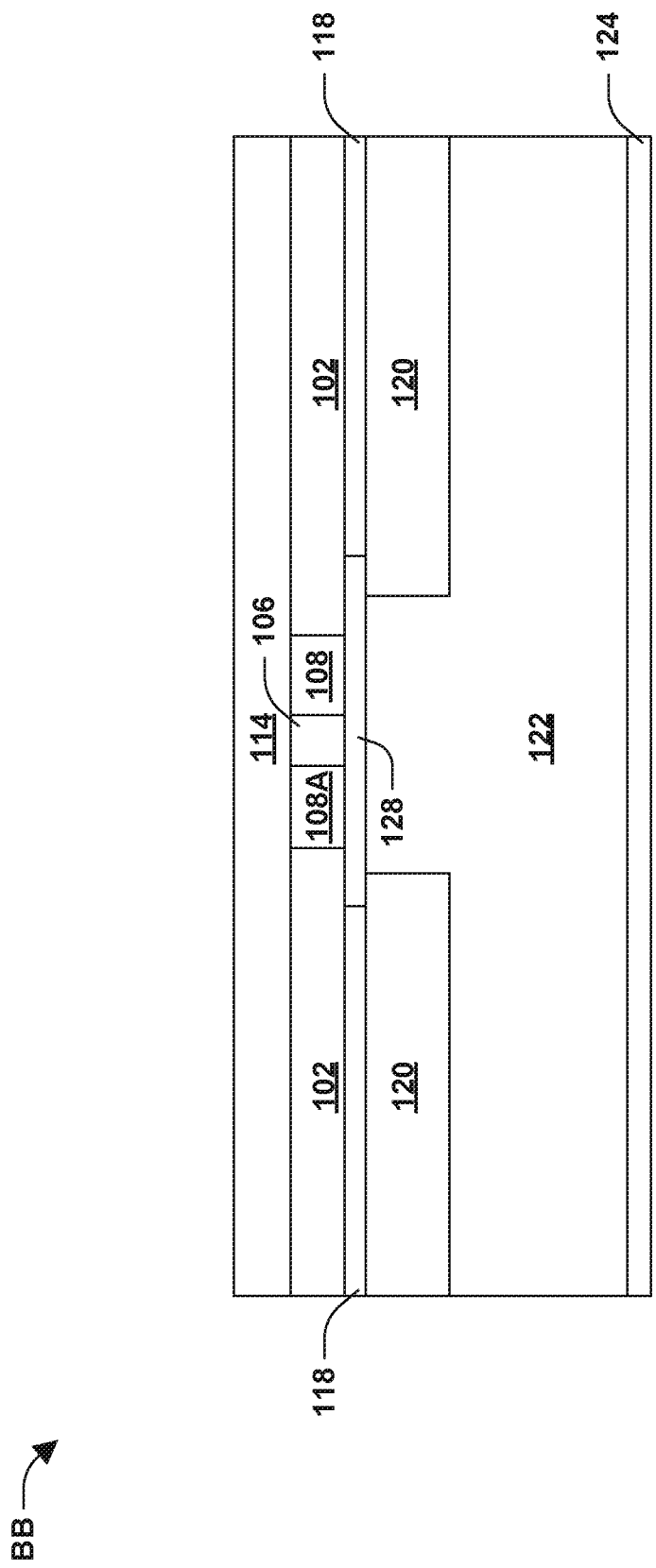
FIG. 1O illustrates a cross-section, defined in FIG. 1A, of a semiconductor device.
FIG. 1D illustrates a cross-section, defined in FIG. 1A, of a semiconductor device during a failure state.
FIG. 1E illustrates an embodiment of a semiconductor device.
FIG. 1F illustrates a cross-section, defined in FIG. 1A, of a semiconductor device.
Figure 1D:
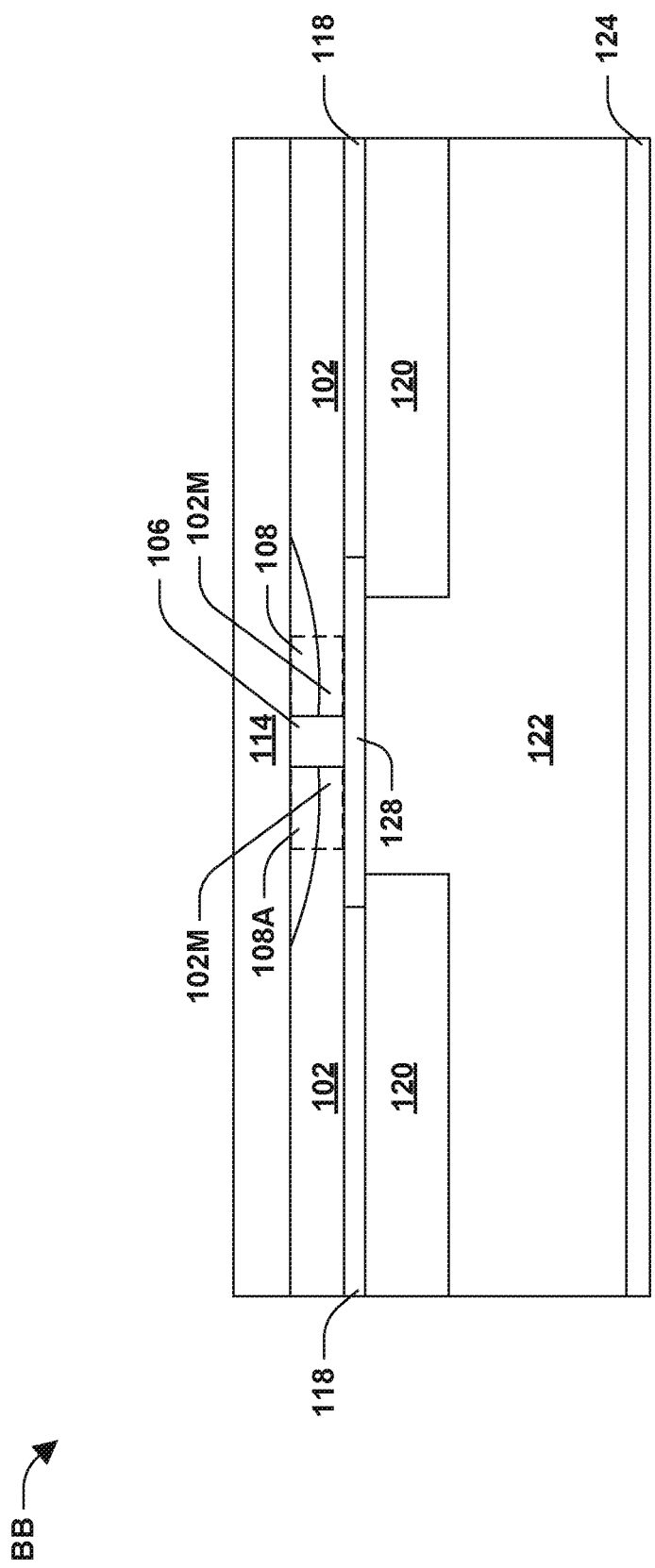

The semiconductor device 100 may comprise an isolation layer 114, illustrated in FIGS. 1B-1D. The isolation layer 114 may overly the first power region 102, the control region 106 and/or the isolation region 104. The isolation layer 114 may comprise a second dielectric material. The second dielectric material may be the same as the first dielectric material of the isolation region 104. Alternatively and/or additionally, the second dielectric material may be different than the first dielectric material.

The semiconductor device 100 may comprise a failure structure 108. The failure structure 108 may extend from the first power region 102, through the isolation region 104, to the control region 106.

FIG. 1B illustrates a cross-section AA, defined in FIG. 1A, of the semiconductor device 100. The first power region 102 may overly a region 118 and/or a cell region 120 of the semiconductor device 100. The region 118 may comprise conductive material. The cell region 120 may comprise active cells, such as transistor cells (e.g., FET cells, MOSFET cells, MISFET cells, MESFET cells, IGFET cells, IGBT cells, HEMT cells, HFET cells and/or MODFET cells). The region 118 may be between the first power region 102 and the cell region 120.

The semiconductor device 100 may comprise a base isolation region 116. The control region 106 and/or the isolation region 104 may overly the base isolation region 116. The base isolation region 116 may comprise a third dielectric material. The third dielectric material may be the same as the first dielectric material and/or the second dielectric material. Alternatively and/or additionally, the third dielectric material may be different than the first dielectric material and/or the second dielectric material.

The semiconductor device 100 may comprise a semiconductor substrate 122 (e.g., a semiconductor body). The isolation layer 114, the first power region 102, the base isolation region 116, the isolation region 104 and/or the region 118 may overly the semiconductor substrate 122.

The semiconductor device 100 may comprise a second power region 124 comprising a second power terminal. The second power terminal is not shown in FIG. 1B. The second power terminal may be coupled to third external circuitry (e.g., a power source, a load of the semiconductor device 100 and/or ground). The second power terminal may comprise a drain terminal and/or a collector terminal. The semiconductor substrate 122 may be between the base isolation region 116 and the second power region 124.

FIG. 10 illustrates a cross-section BB, defined in FIG. 1A, of the semiconductor device 100. The failure structure 108 may overly a second base isolation region 128. The second base isolation region 128 may comprise a fourth dielectric material. The fourth dielectric material may be the same as the third dielectric material. Alternatively and/or additionally, the fourth dielectric material may be different than the third dielectric material. The second base isolation region 128 may be an extension of the base isolation region 116. Alternatively and/or additionally, the second base isolation region 128 may be separate from the base isolation region 116.

In some examples, the failure structure 108 may be configured to change a characteristic of at least some material between the control region 106 and the first power region 102 during a failure state of the semiconductor device 100. In some examples, the characteristic may correspond to a resistance. A first temperature of the failure structure 108 during a normal state of the semiconductor device 100 may be less than a second temperature of the failure structure 108 during the failure state. The normal state may correspond to a state of the semiconductor device 100 before the semiconductor device 100 enters the failure state. A first resistance of the failure structure 108 during the normal state may be higher than a second resistance of the failure structure 108 during the failure state. In some examples, a failure material of the failure structure 108 may have one or more properties (e.g., a composition and/or one or more chemical properties) associated with a decrease in resistance of the failure material as a temperature of the failure material increases. The failure material may be connected to the control region 106 and the first power region 102. In an example, the failure material has a NTC of resistance.

Alternatively and/or additionally, the failure structure 108 may comprise a short circuit structure. The short circuit structure may be configured to form a low-resistive connection between the control region 106 and the first power region 102 during the failure state.

For example, the short circuit structure may comprise a transition structure extending from the first power region 102 to the control region 106. The transition structure may comprise a void, a capillary and/or a cavity (e.g., a hollow cavity). In some examples, the transition structure may comprise air, processing gas and/or other matter.

FIG. 1D illustrates the cross-section BB, defined in FIG. 1A, of the semiconductor device 100 during the failure state. FIG. 1D illustrates an embodiment of the semiconductor device 100 where the failure structure 108 comprises the transition structure extending from the first power region 102 to the control region 106.

A temperature of the first power region 102 may exceed a melting point of the first power region 102 during the failure state. At least a portion of the first power region 102 may melt during the failure state. Melted material 102M of the first power region 102 may pass through the transition structure and contact the control region 106 to form the low-resistive connection. The melted material 102M of the first power region 102 may flow through the transition structure via capillary action (e.g., capillarity and/or the capillary effect). Alternatively and/or additionally, material of the first power region 102 may expand as the material melts and/or increases in temperature (e.g., the material may expand in association with a coefficient of thermal expansion of the material). Expansion of the material may cause at least some of the material (e.g., melted material 102M) to pass through (and/or flow through) the transition structure to form the low-resistive connection.

Alternatively and/or additionally, a temperature of the control region 106 may exceed a melting point (e.g., between 500° C. and 800° C. and/or between 900° C. and 1200° C.) of the control region 106 during the failure state. At least a portion of the control region 106 may melt during the failure state. Melted material of the control region 106 may pass through the transition structure and contact the first power region 102 to form the low-resistive connection.

The low-resistive connection may correspond to a short circuit between the control region 106 and the first power region 102. The semiconductor device 100 may turn off responsive to the low-resistive connection being formed. Current flow through the semiconductor device 100 (e.g., current flow between the first power region 102 and the second power region 124) may be mitigated by the semiconductor device 100 responsive to the low-resistive connection being formed. A temperature of the semiconductor device 100 may decrease responsive to the low-resistive connection being formed. The semiconductor device 100 may be capable of blocking voltage between the first power terminal and the second power terminal, such as voltage exceeding a threshold, responsive to the low-resistive connection being formed.

The semiconductor device 100 may comprise a second failure structure 108A. The second failure structure 108A may be on an opposite side of the control region 106 with respect to the failure structure 108. Similar to the failure structure 108, the second failure structure 108A may be configured to change a characteristic of at least some material between the control region 106 and the first power region 102 during the failure state and/or the failure structure 108 may comprise a second short circuit structure configured to form a portion of the low-resistive connection and/or to form a second low-resistive connection between the control region 106 and the first power region 102 during the failure state.

Figure 1E:
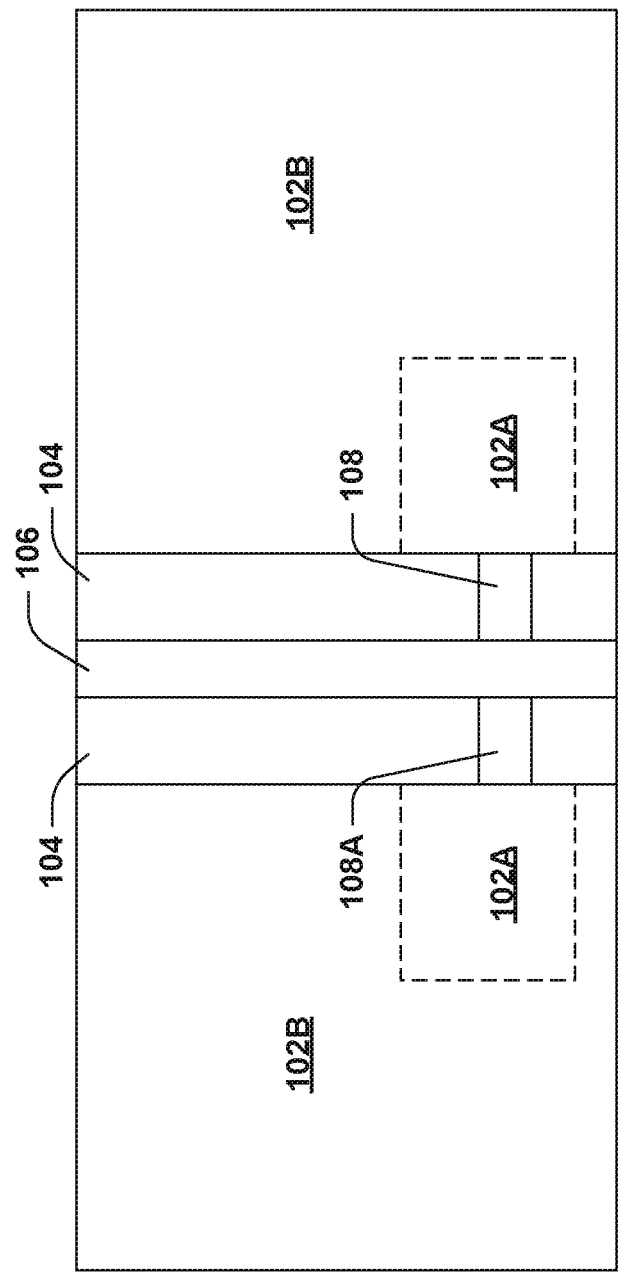

FIG. 1E illustrates an exemplary embodiment of the semiconductor device 100, where the first power region 102 comprises a first portion 102A and a second portion 102B. The first portion 102A may be adjacent to the failure structure 108. The first portion 102A may be between the failure structure 108 and the second portion 102B. A first material (e.g., aluminum) of the first portion 102A may be different than a second material (e.g., copper) of the second portion 102B. Alternatively and/or additionally, the first material may be the same as the second material. A first melting point of the first portion 102A (e.g., between 500° C. and 800° C.) may be less than a second melting point (e.g., between 900° C. and 1200° C.) of the second portion 102B. During the failure state, material of the first portion 102A may melt before material of the second portion 102B melts. Alternatively and/or additionally, material of the first portion 102A may melt during the failure state and/or material of the second portion 102B may not melt during the failure state. Melted material of the first portion 102A may pass through the failure structure 108 (e.g., the transition structure) and contact the control region 106 to form the low-resistive connection.

Figure 1F:
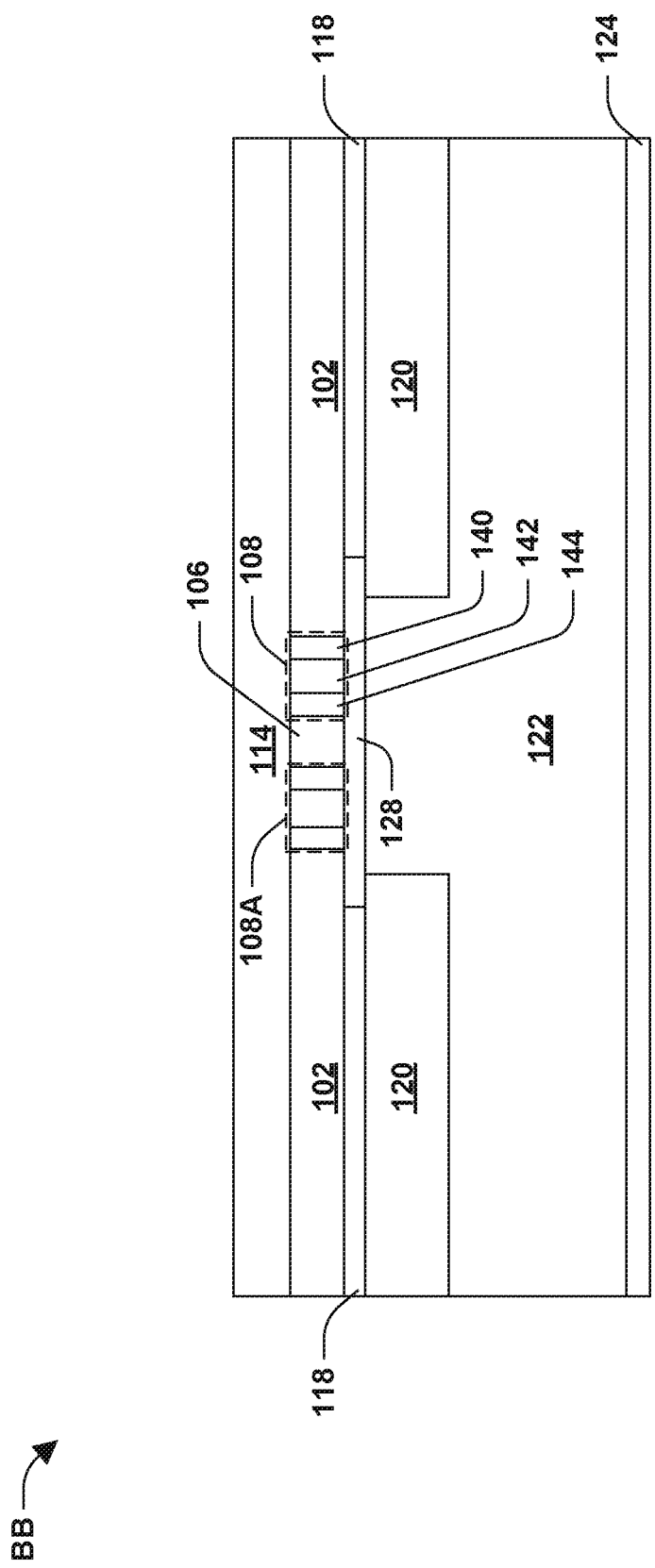

FIG. 1F illustrates the cross-section BB, defined in FIG. 1A, of an exemplary embodiment of the semiconductor device 100 where the failure structure 108 comprises the short circuit structure configured to form the low-resistive connection during the failure state. The short circuit structure may comprise a plurality of regions, such as a first region 140, a second region 142 and/or a third region 144. In some examples, one or more of the plurality of regions may comprise material and/or one or more other regions of the plurality of regions may comprise one or more voids. In an example, the first region 140 may comprise a first void, the second region 142 may comprise the material and/or the third region 144 may comprise a second void. The material of the second region 142 (e.g., aluminum) may be different than a second material (e.g., copper) of the first power region 102. Alternatively and/or additionally, the material may be the same as the second material. A melting point of the material (e.g., between 500° C. and 800° C.) may be less than a melting point of the second material (e.g., between 900° C. and 1200° C.). Alternatively and/or additionally, the melting point of the material may not be less than the melting point of the second material. During the failure state, a temperature of the material may exceed the melting point of the material. At least some of the material may melt during the failure state. Melted material of the second region 142 may pass through the first region 140 and/or the third region 144. The melted material may contact the control region 106 and the first power region 102 to form the low-resistive connection.

Figure 2B:
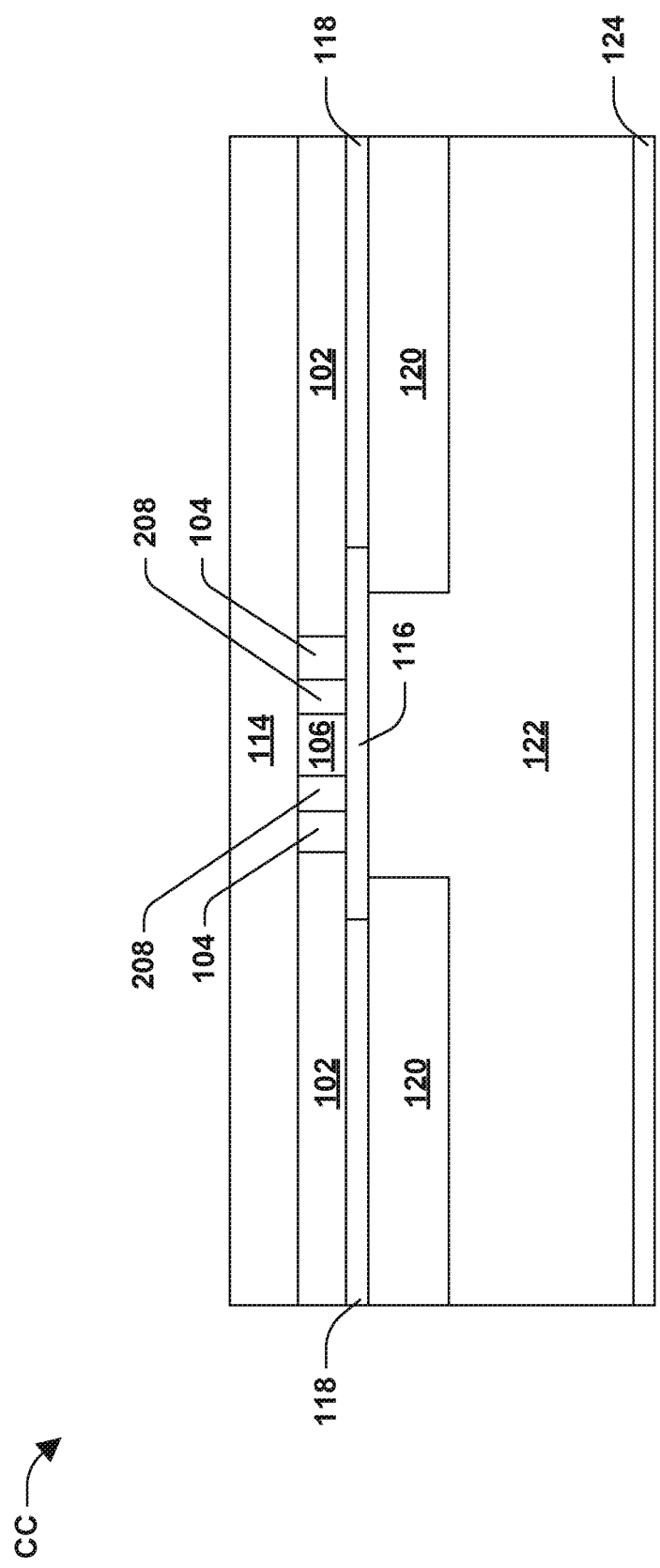
FIG. 2B illustrates a cross-section, defined in FIG. 2A, of a semiconductor device.

FIGS. 2A-2F illustrate aspects with respect to an exemplary embodiment of a semiconductor device 200. FIG. 2A illustrates a portion of the semiconductor device 200. The semiconductor device 200 may comprise the first power region 102. The semiconductor device 200 may comprise the control region 106. The semiconductor device 200 may comprise the isolation region 104 between the first power region 102 and the control region 106. The semiconductor device 200 may comprise the isolation layer 114, illustrated in FIGS. 2B-2E. The isolation layer 114 may overly the first power region 102, the control region 106 and/or the isolation region 104.

The semiconductor device 200 may comprise a failure structure 208. The failure structure 208 may extend from the first power region 102, through the isolation region 104, to the control region 106. The failure structure 208 may be adjacent to an end point of the control region 106. Alternatively and/or additionally, the failure structure 208 may partially surround a portion of the control region 106 at the end point of the control region 106. For example, the failure structure 208 may be adjacent to a first side of the control region 106 corresponding to the end point of the control region 106, a portion of a second side of the control region 106 and/or a portion of a third side of the control region 106. The third side of the control region 106 may be opposite the second side of the control region 106.

FIG. 2B illustrates a cross-section CC, defined in FIG. 2A, of the semiconductor device 200. The semiconductor device 200 may comprise the region 118 and/or the cell region 120. The semiconductor device 200 may comprise the base isolation region 116. The control region 106, the isolation region 104 and/or the failure structure 208 may overly the base isolation region 116.

The semiconductor device 200 may comprise the semiconductor substrate 122. The isolation layer 114, the first power region 102, the base isolation region 116, the isolation region 104 and/or the region 118 may overly the semiconductor substrate 122. The semiconductor device 200 may comprise the second power region 124. The semiconductor substrate 122 may be between the base isolation region 116 and the second power region 124.

As shown in FIG. 2B, a first portion of the failure structure 208 may be adjacent to the second side of the control region 106 and/or a second portion of the failure structure 208 may be adjacent to the third side of the control region 106.

Figure 2C:
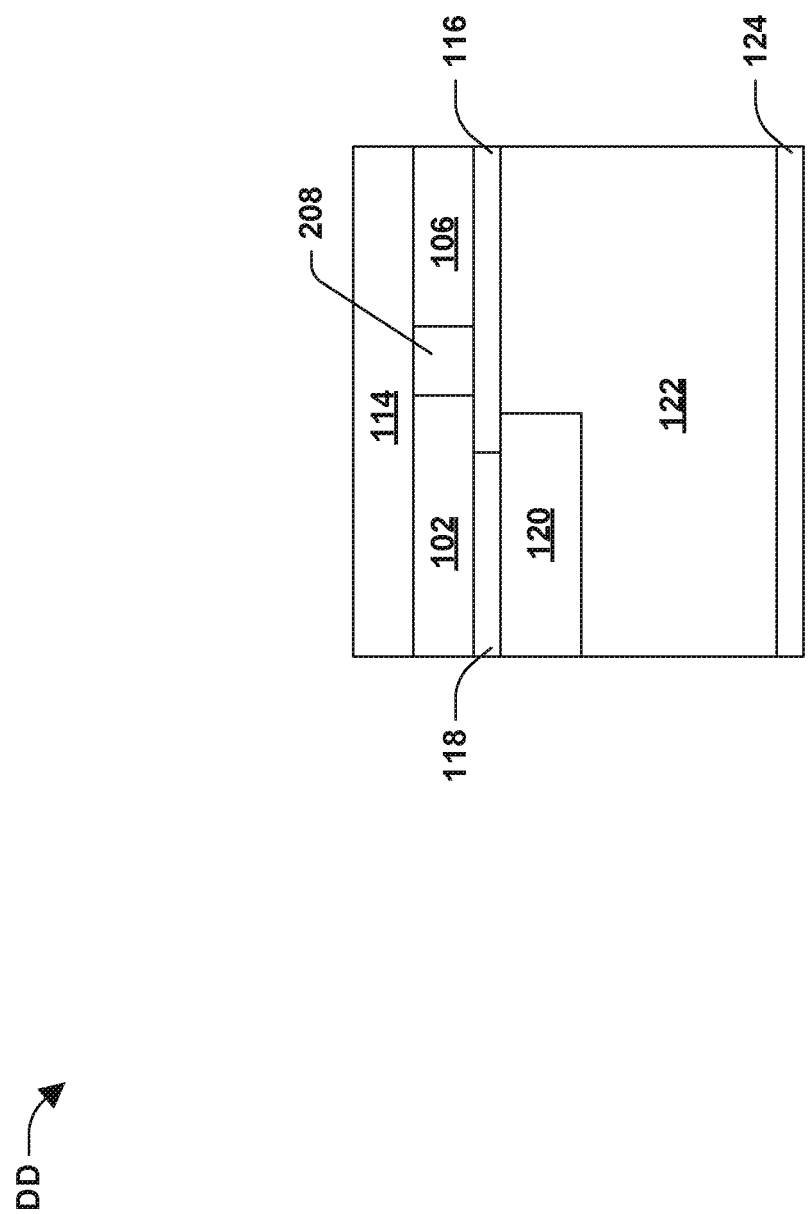
FIG. 2C illustrates a cross-section, defined in FIG. 2A, of a semiconductor device.

FIG. 2C illustrates a cross-section DD, defined in FIG. 2A, of the semiconductor device 200. As shown in FIG. 2C, a third portion of the failure structure 208 may be adjacent to the first side of the control region 106 corresponding to the end point of the control region 106.

In some examples, the failure structure 208 may be configured to change a characteristic of at least some material between the control region 106 and the first power region 102 during a failure state of the semiconductor device 200. In some examples, the characteristic may correspond to a resistance. A first temperature of the failure structure 208 during a normal state of the semiconductor device 200 may be less than a second temperature of the failure structure 208 during the failure state. The normal state may correspond to a state of the semiconductor device 200 before the semiconductor device 200 enters the failure state. A first resistance of the failure structure 208 during the normal state may be higher than a second resistance of the failure structure 208 during the failure state. In some examples, a failure material of the failure structure 208 may have one or more properties (e.g., a composition and/or one or more chemical properties) associated with a reduction in resistance of the failure material as a temperature of the failure material increases. The failure material may be connected to the control region 106 and the first power region 102. In an example, the failure material has a NTC of resistance.

Alternatively and/or additionally, the failure structure 208 may comprise a short circuit structure. The short circuit structure may be configured to form a low-resistive connection between the control region 106 and the first power region 102 during the failure state.

For example, the short circuit structure may comprise a transition structure extending from the first power region 102 to the control region 106. The transition structure may comprise a void, a capillary and/or a cavity (e.g., a hollow cavity). In some examples, the transition structure may comprise air, processing gas and/or other matter.

Figure 2D:
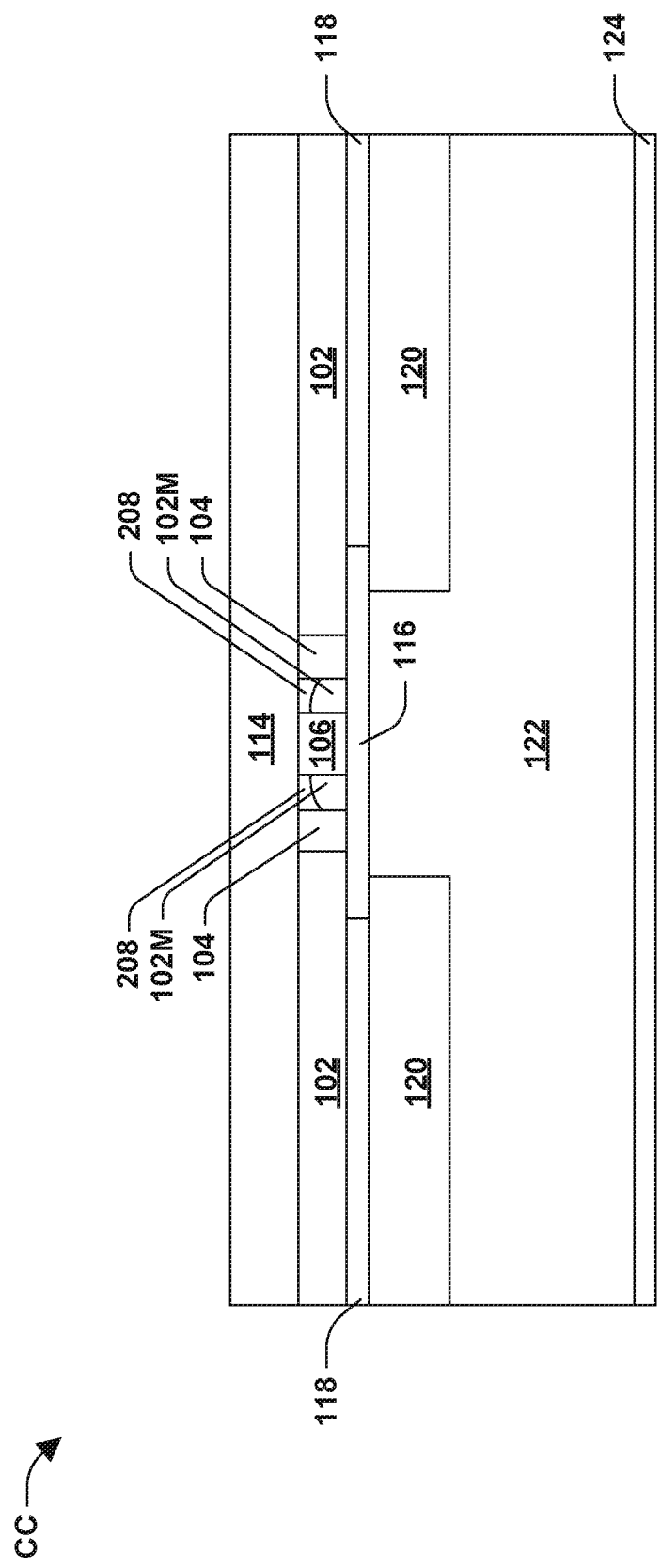
FIG. 2D illustrates a cross-section, defined in FIG. 2A, of a semiconductor device during a failure state.

FIG. 2D illustrates the cross-section CC, defined in FIG. 2A, of the semiconductor device 200 during the failure state.

Figure 2E:
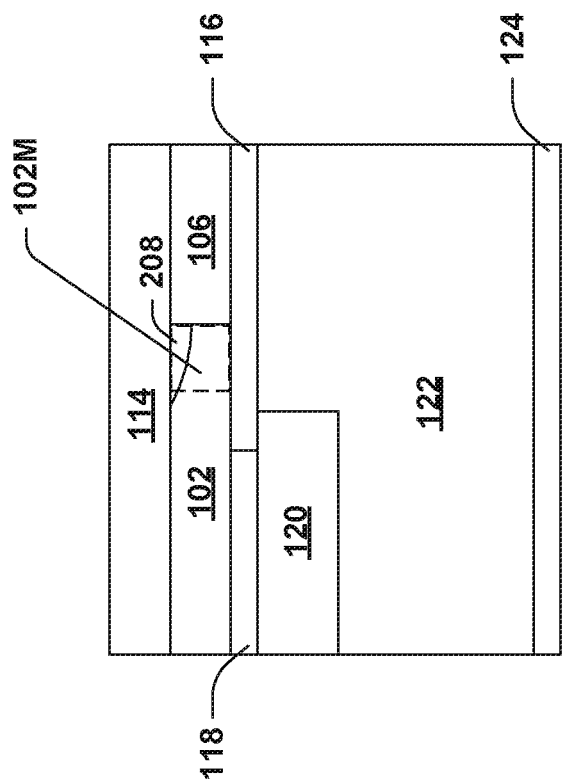
FIG. 2E illustrates a cross-section, defined in FIG. 2A, of a semiconductor device during a failure state.

FIG. 2E illustrates the cross-section DD, defined in FIG. 2A, of the semiconductor device 200 during the failure state. FIGS. 2D-2E illustrate an embodiment of the semiconductor device 200 where the failure structure 208 comprises the transition structure extending from the first power region 102 to the control region 106.

A temperature of the first power region 102 may exceed a melting point of the first power region 102 during the failure state. At least a portion of the first power region 102 may melt during the failure state. Melted material 102M of the first power region 102 may pass through the transition structure and contact the control region 106 to form the low-resistive connection. The melted material 102M of the first power region 102 may flow through the transition structure via capillary action. Alternatively and/or additionally, material of the first power region 102 may expand as the material melts and/or increases in temperature. Expansion of the material may cause at least some of the material (e.g., melted material 102M) to pass through (and/or flow through) the transition structure to form the low-resistive connection. The low-resistive connection may correspond to a short circuit between the control region 106 and the first power region 102. The semiconductor device 200 may turn off responsive to the low-resistive connection being formed. Current flow through the semiconductor device 200 (e.g., current flow between the first power region 102 and the second power region 124) may be mitigated by the semiconductor device 200 responsive to the low-resistive connection being formed. A temperature of the semiconductor device 200 may decrease responsive to the low-resistive connection being formed.

Alternatively and/or additionally, a temperature of the control region 106 may exceed a melting point of the control region 106 during the failure state. At least a portion of the control region 106 may melt during the failure state. Melted material of the control region 106 may pass through the transition structure and contact the first power region 102 to form the low-resistive connection.

Figure 2F:
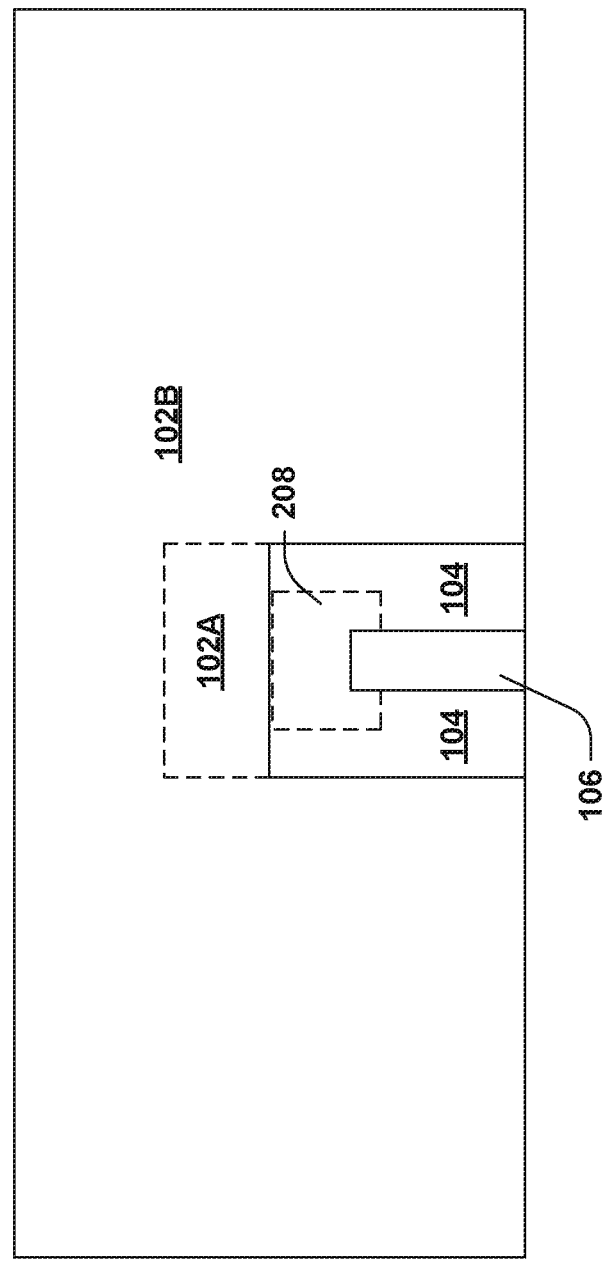
FIG. 2F illustrates an embodiment of a semiconductor device.

FIG. 2F illustrates an exemplary embodiment of the semiconductor device 200, where the first power region 102 comprises the first portion 102A and the second portion 102B. The first portion 102A may be adjacent to the failure structure 208. The first portion 102A may be between the failure structure 208 and the second portion 102B. Melted material of the first portion 102A may pass through the failure structure 208 (e.g., the transition structure) and contact the control region 106 to form the low-resistive connection.

Figure 3A:
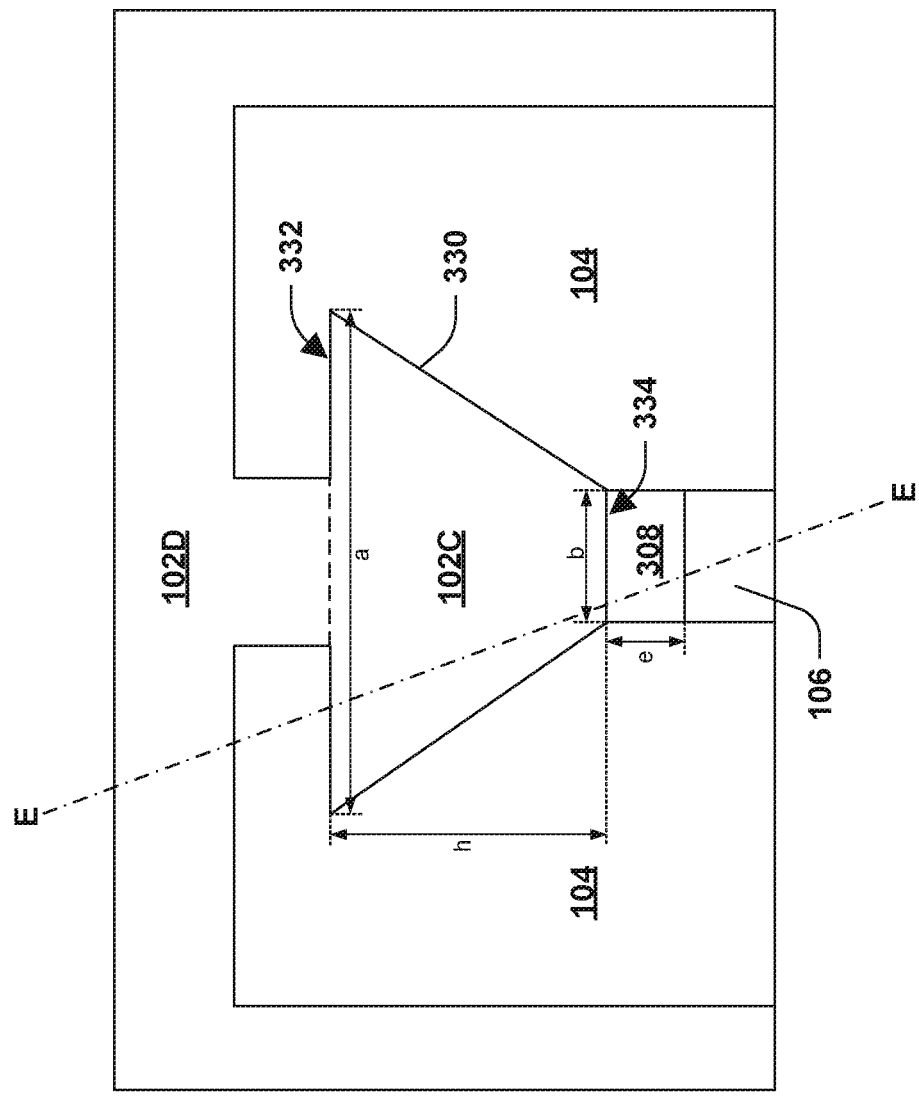
FIG. 3A illustrates an embodiment of a semiconductor device.
Figure 3B:
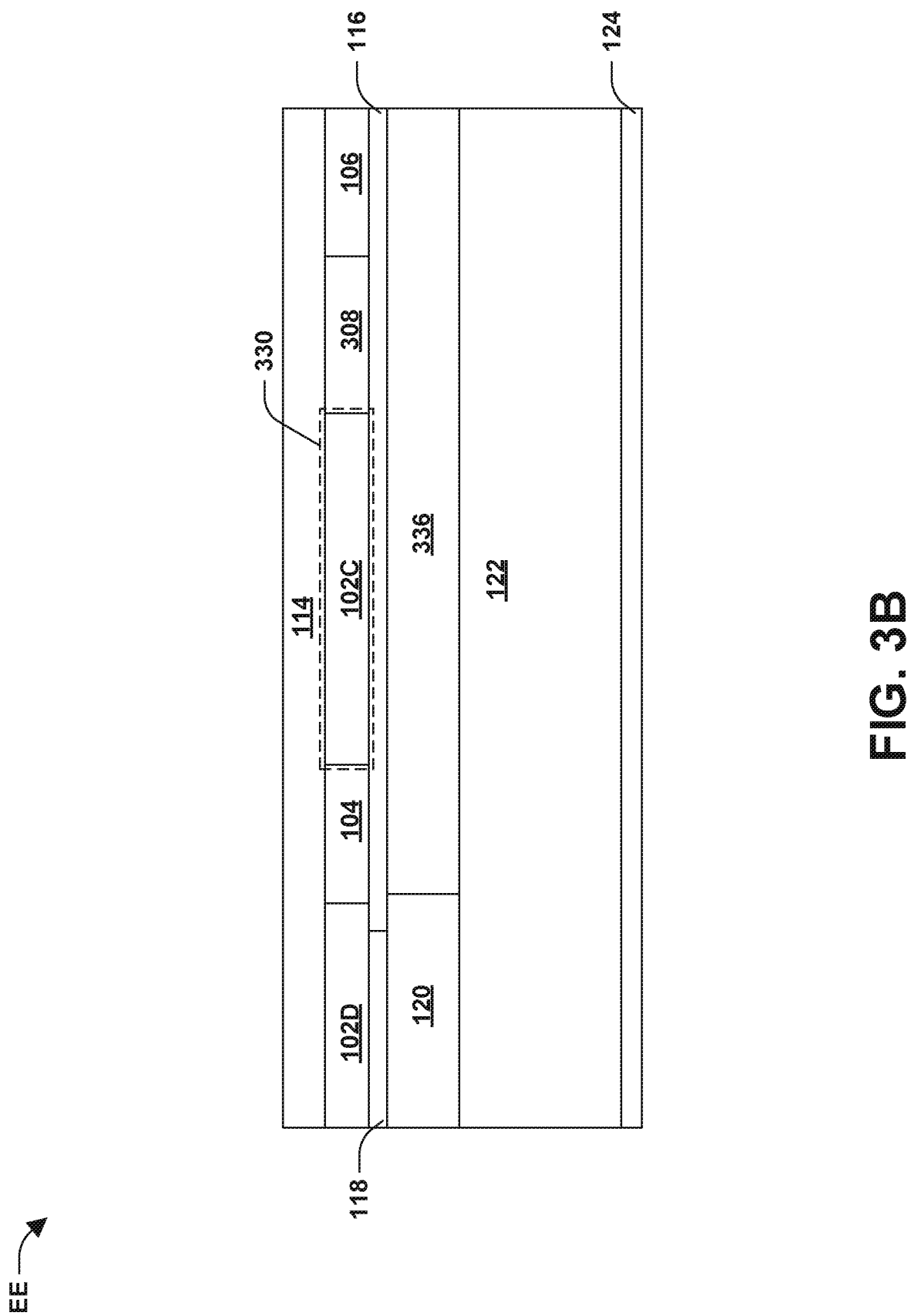
FIG. 3B illustrates a cross-section, defined in FIG. 3A, of a semiconductor device.
Figure 3C:
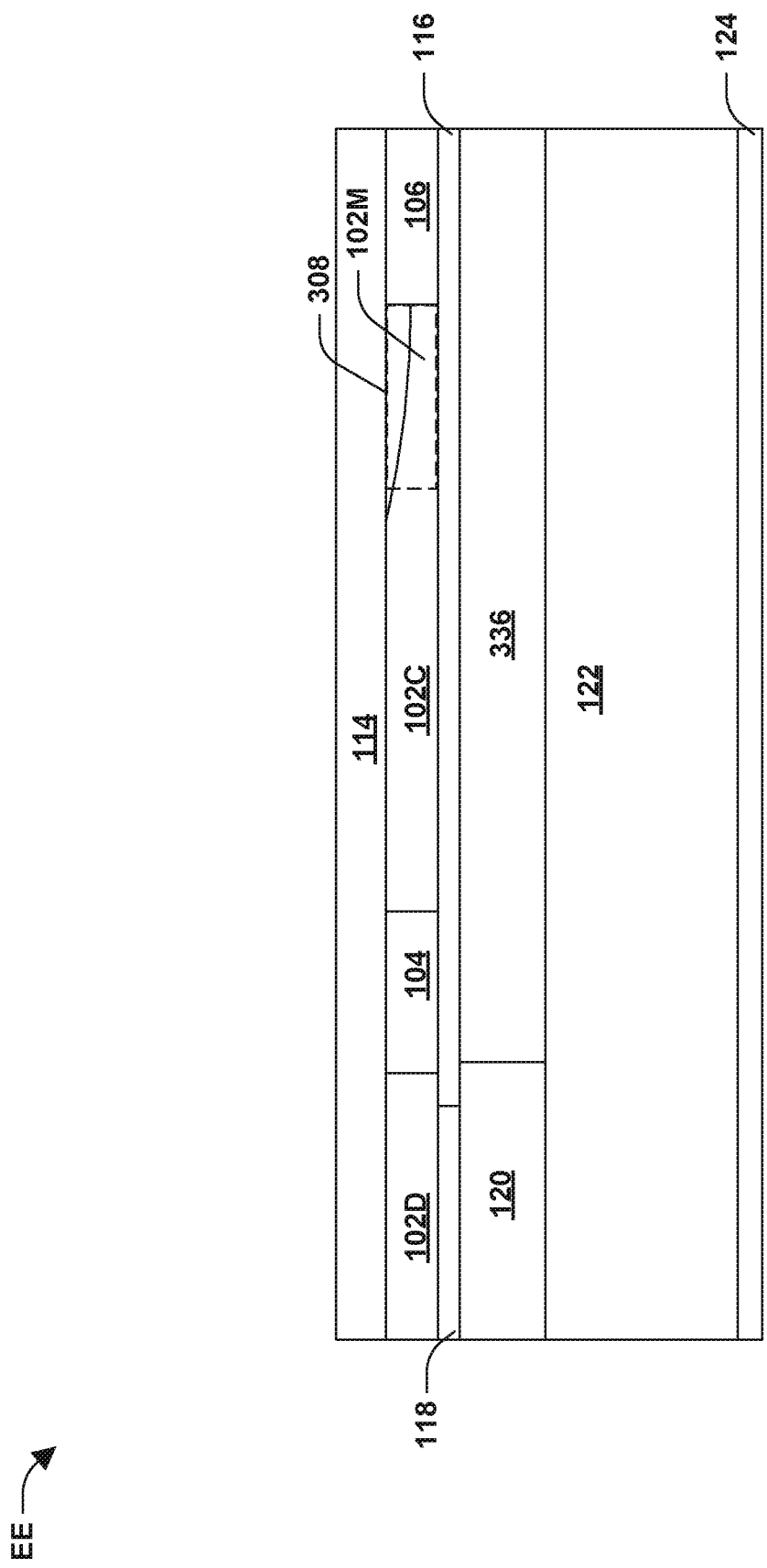
FIG. 3C illustrates a cross-section, defined in FIG. 3A, of a semiconductor device during a failure state.

FIGS. 3A-3C illustrate aspects with respect to an exemplary embodiment of a semiconductor device 300. FIG. 3A illustrates a portion of the semiconductor device 300. The semiconductor device 300 may comprise the first power region 102 comprising a first portion 102C and/or a second portion 102D. The semiconductor device 300 may comprise the control region 106. The semiconductor device 300 may comprise the isolation region 104 between the second portion 102D and the control region 106. The semiconductor device 300 may comprise the isolation layer 114, illustrated in FIGS. 3B-3C. The isolation layer 114 may overly the first power region 102, the control region 106 and/or the isolation region 104.

In some examples, the semiconductor device 300 may comprise a failure structure 308. The failure structure 308 may extend from the first portion 102C, through the isolation region 104, to the control region 106. The failure structure 308 may be adjacent to an end point of the control region 106. Alternatively and/or additionally, the failure structure 308 may partially surround a portion of the control region 106 at the end point of the control region 106. For example, the failure structure 308 may be adjacent to a first side of the control region 106 corresponding to the end point of the control region 106, a portion of a second side of the control region 106 and/or a portion of a third side of the control region 106 (similar to the exemplary embodiment illustrated in FIG. 2A). The third side of the control region 106 may be opposite the second side of the control region 106. Alternatively and/or additionally, the failure structure 308 may be adjacent to the first side of the control region 106 corresponding to the end point and/or may not be adjacent to the second side and/or the third side of the control region 106.

The semiconductor device 300 may comprise a dielectric structure 330 surrounding at least some of the first portion 102C. A portion of the isolation region 104 may be between the first portion 102C and the second portion 102D. In some examples, the dielectric structure 330 may define a first opening between the first portion 102C and the second portion 102D on a first side 332 of the dielectric structure 330. The dielectric structure 330 may define a second opening between the first portion 102C and the failure structure 308 on a second side 334 of the dielectric structure 330.

FIG. 3B illustrates a cross-section EE, defined in FIG. 3A, of the semiconductor device 300. The semiconductor device 300 may comprise the region 118 and/or the cell region 120. The semiconductor device 300 may comprise the base isolation region 116. The control region 106, the isolation region 104, the first portion 102C and/or the failure structure 308 may overly the base isolation region 116. In some examples, the dielectric structure 330 may comprise at least some of the isolation region 104, at least some of the isolation layer 114 and/or at least some of the base isolation region 116 surrounding at least some of the first portion 102C.

The semiconductor device 300 may comprise the semiconductor substrate 122. The isolation layer 114, the first power region 102, the base isolation region 116, the isolation region 104 and/or the region 118 may overly the semiconductor substrate 122. The semiconductor device 300 may comprise the second power region 124. The semiconductor substrate 122 may be between the base isolation region 116 and the second power region 124. In some examples, the semiconductor device 300 may comprise a p-well 336.

In some examples, the failure structure 308 may be configured to change a characteristic of at least some material between the control region 106 and the first portion 102C during a failure state of the semiconductor device 300. In some examples, the characteristic may correspond to a resistance. A first temperature of the failure structure 308 during a normal state of the semiconductor device 300 may be less than a second temperature of the failure structure 308 during the failure state. The normal state may correspond to a state of the semiconductor device 300 before the semiconductor device 300 enters the failure state. A first resistance of the failure structure 308 during the normal state may be higher than a second resistance of the failure structure 308 during the failure state. In some examples, a failure material of the failure structure 308 may have one or more properties (e.g., a composition and/or one or more chemical properties) associated with a reduction in resistance of the failure material as a temperature of the failure material increases. The failure material may be connected to the first portion 102C (via the second opening) and the control region 106. In an example, the failure material has a NTC of resistance.

Alternatively and/or additionally, the failure structure 308 may comprise a short circuit structure. The short circuit structure may be configured to form a low-resistive connection between the control region 106 and the first power region 102 during the failure state.

For example, the short circuit structure may comprise a transition structure extending from the first portion 102C to the control region 106. The transition structure may comprise a void, a capillary and/or a cavity (e.g., a hollow cavity). In some examples, the transition structure may comprise air, processing gas and/or other matter.

FIG. 3C illustrates the cross-section EE, defined in FIG. 3A, of the semiconductor device 300 during the failure state. FIG. 3C illustrates an embodiment of the semiconductor device 300 where the failure structure 308 comprises the transition structure extending from the first portion 102C to the control region 106.

A temperature of the first portion 102C may exceed a melting point of the first portion 102C during the failure state. At least a portion of the first portion 102C may melt during the failure state. Melted material 102M of the first portion 102C may pass through the transition structure and/or the second opening and contact the control region 106 to form the low-resistive connection. The low-resistive connection may correspond to a short circuit between the control region 106 and the first power region 102. The semiconductor device 300 may turn off responsive to the low-resistive connection being formed. Current flow through the semiconductor device 300 (e.g., current flow between the first power region 102 and the second power region 124) may be mitigated by the semiconductor device 300 responsive to the low-resistive connection being formed. A temperature of the semiconductor device 300 may decrease responsive to the low-resistive connection being formed.

The melted material 102M of the first portion 102C may flow through the transition structure via capillary action (e.g., capillarity and/or the capillary effect). Alternatively and/or additionally, material of the first portion 102C may expand as the material melts and/or increases in temperature. Expansion of the material may cause at least some of the material (e.g., melted material 102M) to pass through (and/or flow through) the transition structure to form the low-resistive connection.

In some examples, a size (e.g., a volume) of the dielectric structure 330 and/or a size (e.g., a volume) of the transition structure may be configured such that expansion of material within the dielectric structure 330 causes the material (e.g., melted material 102M) to at least partially fill the transition structure and/or to contact the control region 106. For example, the size of the dielectric structure 330 and/or the size of the transition structure may be configured based upon a coefficient of thermal expansion of the first portion 102C within the dielectric structure 330. For example, it may be determined that the coefficient of thermal expansion of the first portion 102C corresponds to a first percentage of increase in volume of the first portion 102C responsive to the semiconductor device 300 entering the failure state. The size of the transition structure may be determined based upon the first percentage and/or a volume of the first portion 102C (and/or a volume of the dielectric structure 330). Alternatively and/or additionally, a volume of the transition structure may be determined based upon an amount of increase in volume of the first portion 102C responsive to the semiconductor device 300 entering the failure state (e.g., the amount of increase in volume of the first portion 102C may correspond to the first percentage multiplied by the volume of the first portion 102C). For example, the volume of the transition structure may be about equal to the amount of increase in volume of the first portion 102C. Alternatively and/or additionally, the volume of the transition structure may be less than the amount of increase in volume of the first portion 102C. Alternatively and/or additionally, the volume of the transition structure may be greater than the amount of increase in volume of the first portion 102C.

In an example with respect to FIG. 3A, it may be determined (based upon a coefficient of thermal expansion of the first portion 102C within the dielectric structure 330) that a transition structure area of the transition structure being about 10% (and/or a different percentage) of a dielectric structure area of the dielectric structure 330 may result in the material at least partially filling the transition structure and/or contacting the control region 106 when the material melts and/or expands during the failure state. Dimensions a, b and/or h (shown in FIG. 3A) associated with the dielectric structure area and/or dimensions e and/or b (shown in FIG. 3A) associated with the transition structure area may be configured such that the transition structure area is about 10% of the dielectric structure area. In some examples, a corresponds to a length of the first side 332 of the dielectric structure 330, b corresponds to a length of the second side 334 of the dielectric structure 330, h corresponds to a distance between the first side 332 and the second side 334 of the dielectric structure 330, b corresponds to a length of a first side of the transition structure adjacent to the second side 334 of the dielectric structure 330 and/or e corresponds to a length of a second side of the transition structure. For example, the dielectric structure area may be equal to $$\frac{h(a+b)}{2}$$

and/or the transition structure area may be equal to e×b. The dimensions a, b, h and/or e may be determined based upon $$10\% \times \frac{h(a+b)}{2} = e \times b.$$

In an example, e=10 μm, b=20 μm, h=50 μm and/or a=60 μm.

In some examples, at least some material of the first portion 102C may be different than at least some material of the second portion 102D. For example, at least some material of the first portion 102C may comprise aluminum and/or at least some material of the second portion 102D may comprise copper. Alternatively and/or additionally, material of the first portion 102C may be the same as material of the second portion 102D. A first melting point of at least some of the first portion 102C may be less than a second melting point of at least some of the second portion 102D. During the failure state, at least some material of the first portion 102C may melt before at least some material of the second portion 102D melts. Alternatively and/or additionally, at least some material of the first portion 102C may melt during the failure state and/or at least some material of the second portion 102D may not melt during the failure state.

Figure 4:
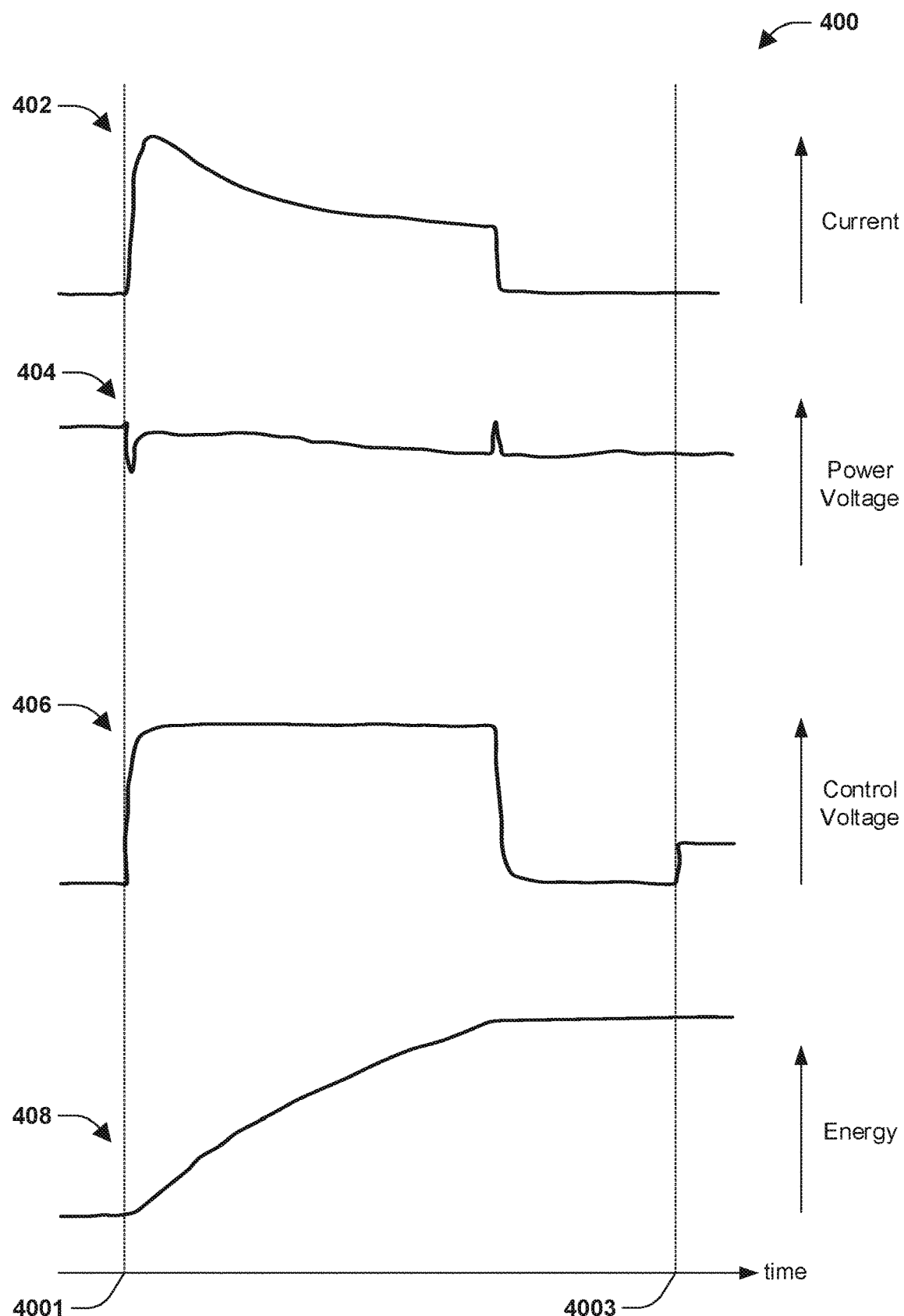
FIG. 4 illustrates a chart associated with semiconductor device operation.

FIG. 4 illustrates a chart 400 associated with operation of an exemplary semiconductor device. The exemplary semiconductor device may comprise a control terminal (e.g., a gate terminal), a first power terminal (e.g., a source terminal and/or an emitter terminal) and/or a second power terminal (e.g., a drain terminal and/or a collector terminal). The chart 400 comprises a current curve 402, a power voltage curve 404, a control voltage curve 406 and an energy curve 408. A horizontal axis of the chart 400 may correspond to time. A vertical axis of the current curve 402 may correspond to levels of current, in amperes, flowing through the second power terminal (and/or through the exemplary semiconductor device). A vertical axis of the power voltage curve 404 may correspond to levels of voltage, in volts, between the first power terminal and the second power terminal. A vertical axis of the control voltage curve 406 may correspond to levels of voltage, in volts, of the control terminal (e.g., a voltage between the control terminal and the first power terminal). A vertical axis of the energy curve 408 may correspond to levels of energy, in joules, dissipated by the exemplary semiconductor device. A level of energy of the energy curve 408 may be proportional and/or related to a temperature of the exemplary semiconductor device.

The exemplary semiconductor device may enter a failure state at a first time 4001. For example, a short-circuit between the first power terminal and the second power terminal may occur at the first time 4001. A level of current, a level of energy and/or a temperature of the exemplary semiconductor device may increase responsive to the exemplary semiconductor device entering the failure state. At a second time 4003, a low-resistive connection is formed between the first power terminal and the control terminal using one or more of the techniques presented herein. By forming the low-resistive connection, the exemplary semiconductor device may turn off and/or shut down before high levels of current and/or high levels of energy cause the exemplary semiconductor device to explode, produce arcs and/or cause destruction to one or more surrounding components.

Figure 5:
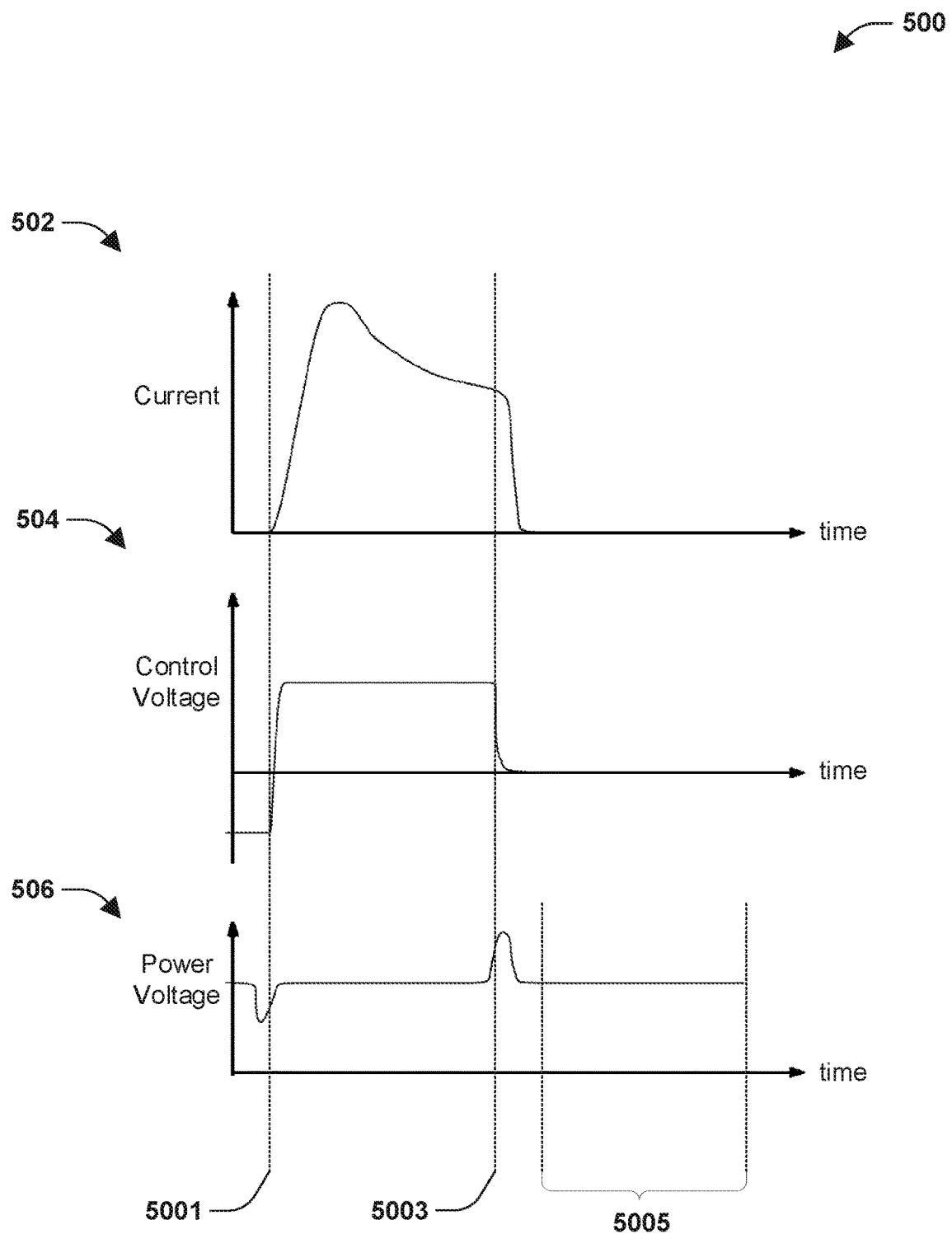
FIG. 5 illustrates a chart associated with semiconductor device operation.

FIG. 5 illustrates a chart 500 associated with operation of an exemplary semiconductor device. The exemplary semiconductor device may comprise a control terminal (e.g., a gate terminal), a first power terminal (e.g., a source terminal and/or an emitter terminal) and/or a second power terminal (e.g., a drain terminal and/or a collector terminal). The chart 500 comprises a current curve 502, a control voltage curve 504 and a power voltage curve 506. A horizontal axis of the chart 500 may correspond to time. A vertical axis of the current curve 502 may correspond to levels of current, in amperes, flowing through the second power terminal (and/or through the exemplary semiconductor device). A vertical axis of the control voltage curve 504 may correspond to levels of voltage, in volts, of the control terminal (e.g., a voltage between the control terminal and the first power terminal). A vertical axis of the power voltage curve 506 may correspond to levels of voltage, in volts, between the first power terminal and the second power terminal.

The exemplary semiconductor device may enter a failure state at a first time 5001. The failure state may correspond to a short-circuit pulse. A level of current, a level of energy and/or a temperature of the exemplary semiconductor device may increase during the short-circuit pulse. During the short-circuit pulse, at a second time 5003, a low-resistive connection is formed between the first power terminal and the control terminal using one or more of the techniques presented herein. By forming the low-resistive connection, the exemplary semiconductor device may turn off and/or shut down before high levels of current and/or high levels of energy cause the exemplary semiconductor device to explode, produce arcs and/or cause destruction to one or more surrounding components. Alternatively and/or additionally, the exemplary semiconductor device may block voltage between the first power terminal and the second power terminal after the low-resistive connection is formed, such as during a period of time 5005, as shown in the power voltage curve 506.

Figure 6:
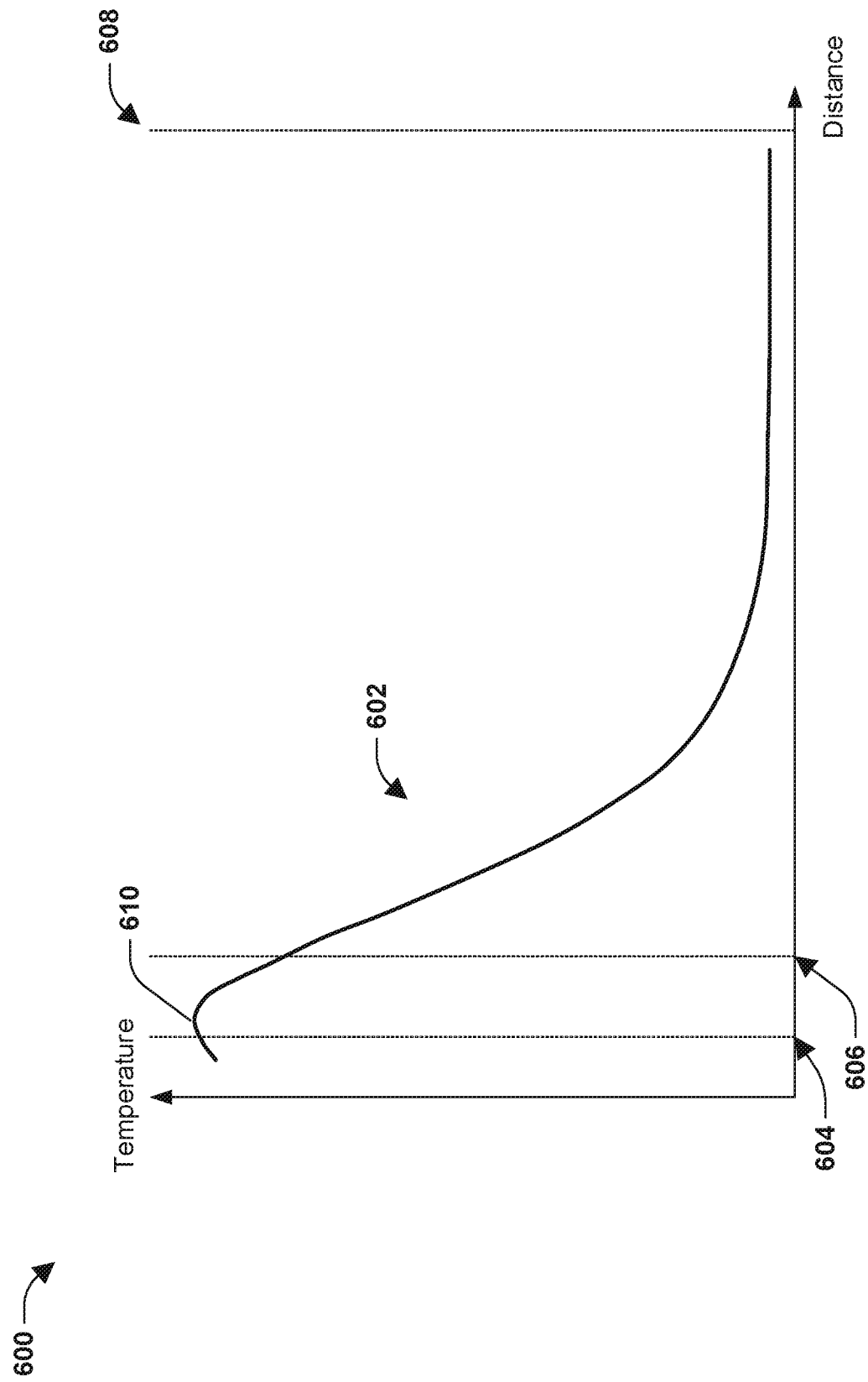
FIG. 6 illustrates a chart associated with a temperature distribution of a semiconductor device during a failure state.

FIG. 6 illustrates a chart 600 associated with a temperature distribution of an exemplary semiconductor device during a failure state of the exemplary semiconductor device. The exemplary semiconductor device may comprise a control region comprising a control terminal (e.g., a gate terminal), a first power region comprising a first power terminal (e.g., a source terminal and/or an emitter terminal) and/or a second power region comprising a second power terminal (e.g., a drain terminal and/or a collector terminal). The chart 600 comprises a temperature curve 602. A vertical axis of the chart 602 may correspond to temperature levels. A horizontal axis of the chart 602 may correspond to distances from a first side of the exemplary semiconductor device. The first side of the exemplary semiconductor device may be proximal the first power region and/or distal the second power region. For example, the first power region may be a distance 604 from the first side of the exemplary semiconductor device and/or the second power region may be a distance 608 from the first side of the exemplary semiconductor device. Alternatively and/or additionally, one or more components of the exemplary semiconductor device may be between the distance 604 from the first side of the exemplary semiconductor device and a distance 606 from the first side of the exemplary semiconductor device. A maximum temperature 610 of the temperature curve 602 may correspond to a region of the exemplary semiconductor device. A distance between the region and the first power region may be less than a distance between the region and the second power region.

In some examples, a semiconductor substrate of the exemplary semiconductor device may comprise a first material. The first material may comprise SiC and/or a different wide band gap material. The exemplary semiconductor device having the first material may cause the maximum temperature 610 and/or a temperature of the first power region to exceed a melting point of the first power region (and/or a melting point of a portion of the first power region) during the failure state, in contrast with some implementations of semiconductor devices comprising other semiconductor materials where a temperature of the first power region may not exceed the melting point of the first power region. For example, the maximum temperature 610 may be between 600° C. and 1200° C. In an example where the exemplary semiconductor device comprises a transition structure, a temperature of the first power region may exceed the melting point of the first power region and/or melted material of the first power region may pass through the transition structure to form a low-resistive connection between the first power region and the control region. Unlike some implementations of semiconductor devices comprising other semiconductor materials, the exemplary semiconductor device having the first material may remain functional during the failure state (e.g., the exemplary semiconductor device may be functional at the maximum temperature 610). In some examples, responsive to forming the low-resistive connection, the exemplary semiconductor device may mitigate current flow between the first power region and the second power region.

It may be appreciated that by applying one or more of the techniques described herein, such as by implementing a failure structure in a semiconductor device, the semiconductor device may turn off in a reduced amount of time (e.g., within a short circuit withstand time window of the semiconductor device) after entering a failure state, which may prevent explosion and/or production of arcs by the semiconductor device and/or may prevent damage to one or more surrounding components. Thus, incorporation of the failure structure in the semiconductor device may result in increased safety associated with operation of the semiconductor device. Further, implementing the failure structure in the semiconductor device may result in a reduction in manufacturing costs. For example, some implementations of semiconductor devices that do not include the failure structure as described herein may require more expensive alternatives to prevent damage to surrounding components, such as expensive gate drivers, short-circuit detection systems, desaturation detection circuits, current sensing systems, explosion-safe enclosures, etc.

It may be appreciated that combinations of one or more embodiments described herein, including combinations of embodiments described with respect to different figures, are contemplated herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

While the subject matter has been described with reference to illustrative embodiments, this description is not intended to be construed in a limiting sense. Various modifications and combinations of the illustrative embodiments, as well as other embodiments of the present disclosure, will be apparent to persons skilled in the art upon reference to the description. It is therefore intended that the appended claims encompass any such modifications or embodiments.

What is claimed is:

1. A semiconductor device, comprising:
   a control region comprising a control terminal;
   a first power region comprising a first power terminal;
   a second power region comprising a second power terminal;
   an isolation region between the control region and the first power region; and
   a short circuit structure extending from the first power region, through the isolation region, to the control region, wherein the short circuit structure is configured to form a low-resistive connection between the control region and the first power region during a failure state of the semiconductor device.

2. The semiconductor device of claim 1, wherein:
   the first power region comprises a first portion adjacent to the short circuit structure;
   the failure state of the semiconductor device corresponds to a temperature of the first portion of the first power region exceeding a first melting point of the first portion of the first power region; and
   during the failure state of the semiconductor device, material of the first portion of the first power region melts to form the low-resistive connection between the control region and the first power region.

3. The semiconductor device of claim 1, wherein:
   the failure state of the semiconductor device corresponds to the semiconductor device having a short circuit between the first power region and the second power region.

4. The semiconductor device of claim 1, wherein:
   the short circuit structure comprises a transition structure extending from the first power region to the control region.

5. The semiconductor device of claim 4, wherein:
   during the failure state of the semiconductor device, melted material of the first power region passes through the transition structure and contacts the control region to form the low-resistive connection between the control region and the first power region.

6. The semiconductor device of claim 4, comprising:
   a dielectric structure surrounding a portion of the first power region, wherein:
     the dielectric structure defines an opening between the first power region and the transition structure; and
     during the failure state of the semiconductor device, melted material of the first power region passes through the opening and the transition structure and contacts the control region to form the low-resistive connection between the control region and the first power region.

7. The semiconductor device of claim 4, wherein the first power region comprises a first portion and a second portion, the semiconductor device comprising:
a dielectric structure surrounding at least some of the first portion of the first power region, wherein:
  a portion of the isolation region is between the first portion of the first power region and the second portion of the first power region;
  the first portion of the first power region is between the second portion of the first power region and the transition structure; and
  during the failure state of the semiconductor device, melted material of the first portion of the first power region passes through the transition structure and contacts the control region to form the low-resistive connection between the control region and the first power region.

8. The semiconductor device of claim 7, wherein:
a first material of the first portion of the first power region is the same as a second material of the second portion of the first power region.

9. The semiconductor device of claim 7, wherein:
a first material of the first portion of the first power region is different than a second material of the second portion of the first power region.

10. The semiconductor device of claim 9, wherein:
a first melting point of the first material is less than a second melting point of the second material.

11. The semiconductor device of claim 4, wherein:
the first power region comprises a first portion and a second portion, wherein a first material of the first portion of the first power region is different than a second material of the second portion of the first power region;
the first portion of the first power region is between the second portion of the first power region and the transition structure; and
during the failure state of the semiconductor device, melted material of the first portion of the first power region passes through the transition structure and contacts the control region to form the low-resistive connection between the control region and the first power region.

12. The semiconductor device of claim 11, wherein:
a first melting point of the first material is less than a second melting point of the second material.

13. The semiconductor device of claim 4, wherein:
the first power region comprises a first portion and a second portion, wherein a first melting point of the first portion of the first power region is less than a second melting point of the second portion of the first power region;
the first portion of the first power region is between the second portion of the first power region and the transition structure; and
during the failure state of the semiconductor device, melted material of the first portion of the first power region passes through the transition structure and contacts the control region to form the low-resistive connection between the control region and the first power region.

14. The semiconductor device of claim 13, wherein:
the first portion of the first power region comprises aluminum; and
the second portion of the first power region comprises copper.

15. The semiconductor device of claim 1, comprising:
a semiconductor substrate comprising at least one of silicon carbide (SiC), gallium arsenide (GaAs), gallium nitride (GaN) or gallium(II) oxide (GaO), wherein the isolation region overlies the semiconductor substrate, wherein the semiconductor substrate has a band gap greater than 1.1 electron volts (eV).

16. The semiconductor device of claim 1, wherein:
the control terminal comprises a gate terminal;
the first power terminal comprises at least one of a source terminal or an emitter terminal; and
the second power terminal comprises at least one of a drain terminal or a collector terminal.

17. The semiconductor device of claim 1, wherein:
the failure state of the semiconductor device corresponds to a temperature of the short circuit structure exceeding a melting point of the short circuit structure; and
during the failure state of the semiconductor device, material of the short circuit structure melts to form the low-resistive connection between the control region and the first power region.

* * * * *